United States Patent
Morita et al.

(10) Patent No.: US 10,854,140 B2
(45) Date of Patent: Dec. 1, 2020

(54) DISPLAY DEVICE

(71) Applicant: Japan Display Inc., Tokyo (JP)

(72) Inventors: Tetsuo Morita, Tokyo (JP); Hiroyuki Kimura, Tokyo (JP); Makoto Shibusawa, Tokyo (JP); Hiroshi Tabatake, Tokyo (JP); Yasuhiro Ogawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/394,113

(22) Filed: Apr. 25, 2019

(65) Prior Publication Data

US 2019/0251903 A1    Aug. 15, 2019

Related U.S. Application Data

(63) Continuation of application No. 15/670,241, filed on Aug. 7, 2017, now Pat. No. 10,319,297.

(30) Foreign Application Priority Data

Aug. 29, 2016  (JP) .................................. 2016-166528

(51) Int. Cl.
*H01L 27/32* (2006.01)
*H01L 29/786* (2006.01)
(Continued)

(52) U.S. Cl.
CPC ....... *G09G 3/3233* (2013.01); *G02F 1/13452* (2013.01); *G02F 1/13454* (2013.01);
(Continued)

(58) Field of Classification Search
CPC ............. G02F 1/13452; G02F 1/13454; G02F 1/13624; G02F 1/136286; G02F 1/1368;
(Continued)

(56) References Cited

U.S. PATENT DOCUMENTS 10,002,968 B2   6/2018 Yoneda
10,204,976 B2   2/2019 Kim et al.
(Continued)

FOREIGN PATENT DOCUMENTS

CN    103927975 A    7/2014
JP    2015-225104 A   12/2015
(Continued)

OTHER PUBLICATIONS

Korean Office Action dated Apr. 18, 2019 for the corresponding Korean patent application No. 10-2017-0098531, with Partial English translation.

(Continued)

*Primary Examiner* — Michael J Eurice
(74) *Attorney, Agent, or Firm* — Michael Best & Friedrich LLP

(57) ABSTRACT

Disclosed is a display device including: a driving transistor, a first switching transistor, and a pixel transistor each having a gate and a pair of terminals; a storage capacitor having a pair of terminals; and a light-emitting element having an input terminal and an output terminal. One terminal of the driving transistor is electrically connected to one terminal of the pixel transistor. The other terminal of the driving transistor is electrically connected to one terminal of the first switching transistor and the input terminal of the light-emitting element. The other terminal of the first switching transistor is electrically connected to the gate of the driving transistor and one terminal of the capacitor. The one terminal of the capacitor overlaps with an active region of the driving transistor.

13 Claims, 25 Drawing Sheets

(51) Int. Cl.
*H01L 51/50* (2006.01)
*H01L 51/52* (2006.01)
*G09G 3/3233* (2016.01)
*G02F 1/1345* (2006.01)
*H01L 27/12* (2006.01)
*G02F 1/1362* (2006.01)

(52) U.S. Cl.
CPC ...... *H01L 27/1225* (2013.01); *H01L 27/1251* (2013.01); *H01L 27/1255* (2013.01); *H01L 27/3262* (2013.01); *H01L 27/3272* (2013.01); *H01L 29/7869* (2013.01); *G02F 1/13624* (2013.01); *G02F 1/136286* (2013.01); *G09G 2300/0819* (2013.01); *G09G 2300/0842* (2013.01); *G09G 2300/0861* (2013.01); *G09G 2310/0256* (2013.01); *G09G 2320/0238* (2013.01)

(58) Field of Classification Search
CPC .. G09G 3/3225; G09G 3/3233; G09G 3/3258; G09G 3/3648; G09G 3/3677; G09G 2300/0426; G09G 2300/0439; G09G 2300/08; G09G 2300/0819; G09G 2300/0842; G09G 2300/0861; G09G 2310/0251; G09G 2310/0256; G09G 2310/061; G09G 2320/0238; H01L 21/02164; H01L 27/1225; H01L 27/1251; H01L 27/1255; H01L 27/3262; H01L 27/3272; H01L 29/7869; H01L 51/5012
See application file for complete search history.

(56) References Cited

U.S. PATENT DOCUMENTS

| | | | | |
|---|---|---|---|---|
| 2004/0090434 A1* | 5/2004 | Miyazawa | ........... | G09G 3/3241 345/204 |
| 2004/0129933 A1* | 7/2004 | Nathan | ................. | G09G 3/3233 257/40 |
| 2006/0054893 A1* | 3/2006 | Nathan | ................. | G09G 3/3233 257/72 |
| 2009/0184984 A1* | 7/2009 | Takahara | ............. | G09G 3/2014 345/690 |
| 2010/0182223 A1 | 7/2010 | Choi et al. | | |
| 2010/0193912 A1* | 8/2010 | Speakman | ................. | G03F 1/56 257/618 |
| 2011/0128211 A1 | 6/2011 | Ono | | |
| 2011/0292019 A1* | 12/2011 | Yamamoto | ........... | G09G 3/3258 345/211 |
| 2013/0221356 A1* | 8/2013 | Yamazaki | ........... | H01L 27/0688 257/57 |
| 2014/0111557 A1* | 4/2014 | Omata | ................. | G09G 3/3233 345/690 |
| 2014/0340432 A1* | 11/2014 | Chaji | ................... | G09G 3/3233 345/690 |
| 2015/0053935 A1* | 2/2015 | Gupta | ................. | H01L 27/3262 257/40 |
| 2015/0055051 A1* | 2/2015 | Osawa | ................. | H01L 27/1251 349/48 |
| 2015/0187266 A1 | 7/2015 | Qian et al. | | |
| 2015/0187276 A1* | 7/2015 | Shim | .................... | G09G 3/3233 345/77 |
| 2015/0206933 A1* | 7/2015 | Koshihara | ........... | H01L 27/3276 257/40 |
| 2015/0243220 A1 | 8/2015 | Kim et al. | | |
| 2016/0012775 A1* | 1/2016 | Jeong | .................. | H01L 27/1222 345/690 |
| 2016/0240565 A1* | 8/2016 | Kim | .................. | H01L 29/78606 |
| 2016/0240601 A1* | 8/2016 | Kwon | ................. | H01L 27/3276 |
| 2016/0337607 A1* | 11/2016 | Okamoto | ............. | H01L 31/0272 |
| 2017/0270866 A1* | 9/2017 | Asano | .................. | G09G 3/3258 |
| 2017/0358609 A1 | 12/2017 | Yamazaki et al. | | |
| 2018/0158844 A1* | 6/2018 | Choi | ................... | H01L 27/1225 |

FOREIGN PATENT DOCUMENTS

| | | |
|---|---|---|
| KR | 10-2013-0099847 A | 9/2013 |
| KR | 10-2016-0007982 A | 1/2016 |
| KR | 10-2016-0099758 A | 8/2016 |
| TW | 201624451 A | 7/2016 |
| TW | 201630180 A | 8/2016 |
| WO | 2015/031037 A1 | 3/2015 |

OTHER PUBLICATIONS

Chinese Office Action dated Dec. 30, 2019 for the corresponding Chinese patent application No. 201710683364.8, with partial English translation.
Taiwanese Office Action dated Apr. 24, 2018 for corresponding Taiwanese Patent Application No. 106123439, with partial translation.
Korean Office Action dated Oct. 20, 2018 for the corresponding Korean patent application No. 10-2017-0098531, with partial English translation.
Japanese Office Action dated Jun. 2, 2020 for the corresponding Japanese Application No. 2016-166528, with partial English Machine Translation retrieved from the EPO Global Dossier.

* cited by examiner

DISPLAY DEVICE

CROSS-REFERENCE TO RELATED APPLICATIONS

This application is a continuation of U.S. patent application Ser. No. 15/670,241, filed on Aug. 7, 2017. Further, this application is based on and claims the benefit of priority from Japanese Patent Application No. 2016-166528, filed on Aug. 29, 2016, the entire contents of which are incorporated herein by reference.

FIELD

An embodiment of the present invention relates to a pixel circuit and a display device. For example, an embodiment of the present invention relates to a pixel circuit including a display element configured by an organic electroluminescence (hereinafter, referred to as "organic EL") material and a display device having the same.

BACKGROUND

As a typical example exhibiting semiconductor properties, Group 14 elements such as silicon and germanium are represented. Particularly, silicon has been utilized in almost all of the semiconductor devices because of its wide availability, ease of processing, excellent semiconductor properties, and ease of controlling the properties. Similar to silicon, an oxide exemplified by an oxide of a Group 13 element such as indium and gallium also shows semiconductor properties and can be used in a semiconductor element such as a transistor. As exemplarily disclosed in Japanese patent application publication No. 2015-225104, International publication No. WO2015/031037, and United States patent application publication 2010/0182223, a semiconductor device in which both a transistor having a silicon-including semiconductor (hereinafter, referred to as a silicon semiconductor) and a transistor having an oxide semiconductor are incorporated has been developed.

SUMMARY

An embodiment of the present invention is a display device including: a driving transistor having a gate and a pair of terminals; a first switching transistor having a gate and a pair of terminals; a pixel transistor having a gate and a pair of terminals; a storage capacitor having a pair of terminals; and a light-emitting element having an input terminal and an output terminal. One of the pair of terminals of the driving transistor is electrically connected to one of the pair of terminals of the pixel transistor. The other of the pair of terminals of the driving transistor is electrically connected to one of the pair of terminals of the first switching transistor and the input terminal of the light-emitting element. The other of the pair of terminals of the first switching transistor is electrically connected to the gate of the driving transistor and one of the pair of terminals of the storage capacitor. The one of the terminals of the storage capacitor overlaps with an active region of the driving transistor.

An embodiment of the present invention is a display device including: a driving transistor having a gate and a pair of terminals; a first switching transistor having a gate and a pair of terminals; a pixel transistor having a gate and a pair of terminals; a reference transistor having a gate and a pair of terminals; a storage capacitor having a pair of terminals; and a light-emitting element having an input terminal and an output terminal. One of the pair of terminals of the driving transistor is electrically connected to one of the pair of terminals of the first switching transistor and the input terminal of the light-emitting element. The other of the pair of terminals of the first switching transistor is electrically connected to the gate of the driving transistor and one of the pair of terminals of the storage capacitor. The other of the pair of terminals of the storage capacitor is electrically connected to one of the pair of terminals of the pixel transistor and one of the pair of terminals of the reference transistor. The one of the pair of terminals of the storage capacitor overlaps with an active region of the driving transistor. An active region of the pixel transistor and an active region of the reference transistor overlap with an active region of the first switching transistor.

An embodiment of the present invention is a display device including: a driving transistor having a gate and a pair of terminals; a first switching transistor having a gate and a pair of terminals; a pixel transistor having a gate and a pair of terminals; a reference transistor having a gate and a pair of terminals; a reset transistor having a gate and a pair of terminals; a storage capacitor having a pair of terminals; and a light-emitting element having an input terminal and an output terminal. One of the pair of terminals of the driving transistor is electrically connected to one of the pair of terminals of the first switching transistor and the input terminal of the light-emitting element. The other of the pair of terminals of the first switching transistor is electrically connected to the gate of the driving transistor and one of the pair of terminals of the storage capacitor. The other of the pair of terminals of the storage capacitor is electrically connected to one of the pair of terminals of the pixel transistor and one of the pair of terminals of the reference transistor. The one of the pair of terminals of the storage capacitor overlaps with an active region of the driving transistor. An active region of the pixel transistor, an active region of the reference transistor, and an active region of the reset transistor overlap with an active region of the first switching transistor.

DESCRIPTION OF EMBODIMENTS

Hereinafter, the embodiments of the present invention are explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the present invention, when a plurality of films is formed by processing one film, the plurality of films may have functions or rules different from each other. However, the plurality of films originates from a film formed as the same layer in the same process and has the same layer structure and the same material. Therefore, the plurality of films is defined as films existing in the same layer.

In the specification and the scope of the claims, unless specifically stated, when a state is expressed where a structure is arranged "over" another structure, such an expression includes both a case where the substrate is arranged immediately above the "other structure" so as to be in contact with the "other structure" and a case where the structure is arranged over the "other structure" with an additional structure therebetween.

First Embodiment

Figure 1:
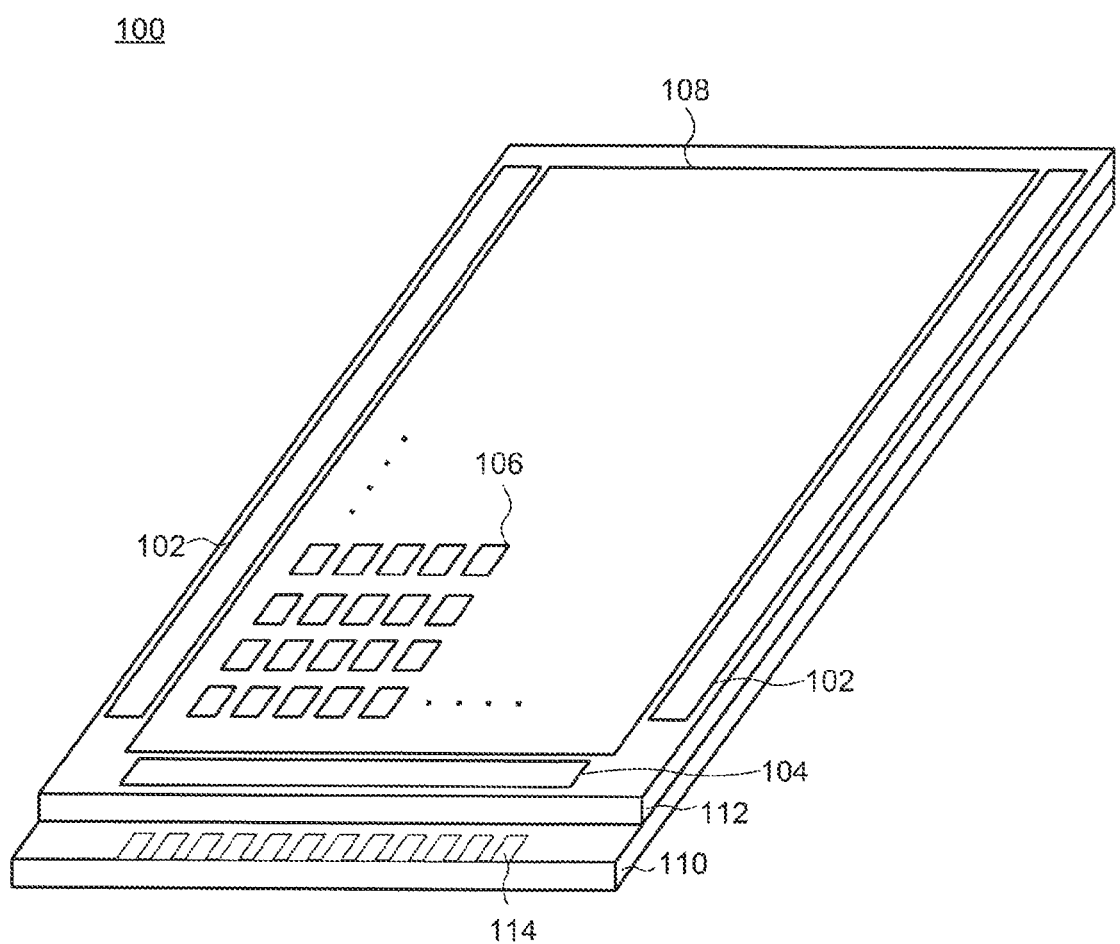
FIG. 1 is a schematic perspective view of a display device according to an embodiment of the present application.

FIG. 1 is a perspective view of a display device 100 according to the First Embodiment of the present invention. The display device 100 possesses, over one surface (top surface) of a substrate 110, a pixel region 108 including a plurality of pixels 106 arranged in a row direction and a column direction, scanning-line driver circuits 102, and a data-line driver circuit 104. The pixel region 108, the scanning-line driver circuits 102, and the data-line driver circuit 104 are disposed between the substrate 110 and an opposing substrate 112. A variety of signals is input from an external circuit (not shown) to the scanning-line driver circuits 102 and the data-line driver circuit 104 through a connector such as a flexible printed circuit (FPC) connected to terminals 114 formed over the substrate 110, and each pixel 106 is controlled on the basis of these signals.

The plurality of pixels 106 is provided with display elements giving different colors from one another, such as an organic light-emitting element and a liquid crystal element, by which full-color display is performed. For example, display elements giving red, green, and blue colors may be arranged in the respective three pixels 106. Alternatively, display elements providing white color may be used in all pixels 106, and full-color display may be conducted by extracting red, green, and blue colors from respective pixels 106 with a color filter. The colors eventually extracted are not limited to a combination of red, green, and blue colors. For example, four colors of red, green, blue, and white may be respectively extracted from four pixels 106. An arrangement of the pixels 106 is also not limited, and a stripe arrangement, a delta arrangement, a Pentile arrangement, and the like may be applied. Note that, in the present specification, an example is explained in which an organic light-emitting element (hereinafter, simply referred to as a light-emitting element) is included in the pixel 106 as a display element.

Figure 2:
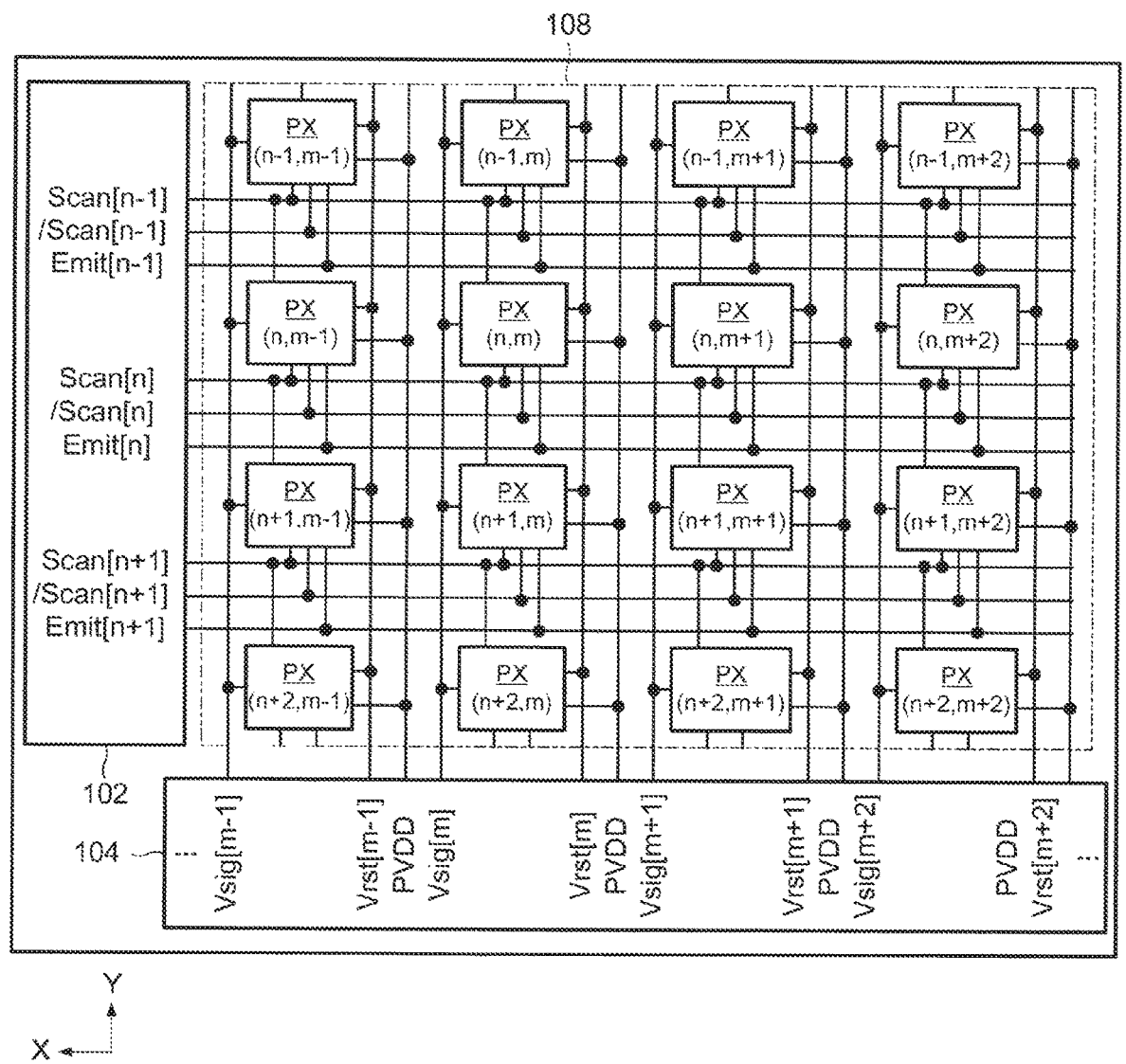
FIG. 2 is a schematic drawing showing a structure of a display device according to an embodiment of the present application.

FIG. 2 is a schematic drawing of the pixel region 108 of the display device 100. The display device 100 is an organic EL display device in which an active-matrix type driving method is employed. In the pixel region 108, the plurality of pixels 106 is arranged in a matrix form in an X direction and a Y direction perpendicular to each other, and a pixel circuit PX is provided in each pixel 106. Hereinafter, an explanation is given for the case where the matrix has a square arrangement with N rows and M columns.

One light-emitting element OLED is arranged in every pixel circuit PX as described below. The scanning-line driver circuit 102 and the data-line driver circuit 104 have a role to drive the light-emitting element OLED in each pixel circuit PX so that the light-emitting elements OLED emit light to form an image.

Specifically, the scanning-line driver circuit 102 is configured to commonly supply a scanning signal Scan[n], an inverted signal/Scan[n] of the scanning signal Scan[n], and an emit signal Emit[n] to the plurality of pixel circuits PX located in the nth row of the matrix formed in the pixel region 108. n is an integer from 1 to N (the number of the rows of the matrix). The scanning signal Scan[n] is also supplied to the plurality of pixel circuits PX located in the (n+1)th row.

The data-line driver circuit 104 is configured to commonly supply an image signal Vsig[m] and a reset signal Vrst[m] to the plurality of pixel circuits PX located in the mth column of the matrix formed in the pixel region 108. m is an integer from 1 to M (the number of columns of the matrix). In the following explanation, potentials of the image signal Vsig[m] and the reset signal Vrst[m] are expressed by Vsig[m] and Vrst[m], respectively. This expression manner is similarly applied to other signals described below. The data-line driver circuit 104 is further configured to supply a power-source potential PVDD to each pixel circuit PX through a high-potential power-source line. Although not shown in FIG. 2, a common electrode commonly provided to the pixel circuits PX is arranged in the pixel region 108, and the data-line driver circuit 104 is configured to supply a ground potential PVSS to the common electrode.

Figure 3A:
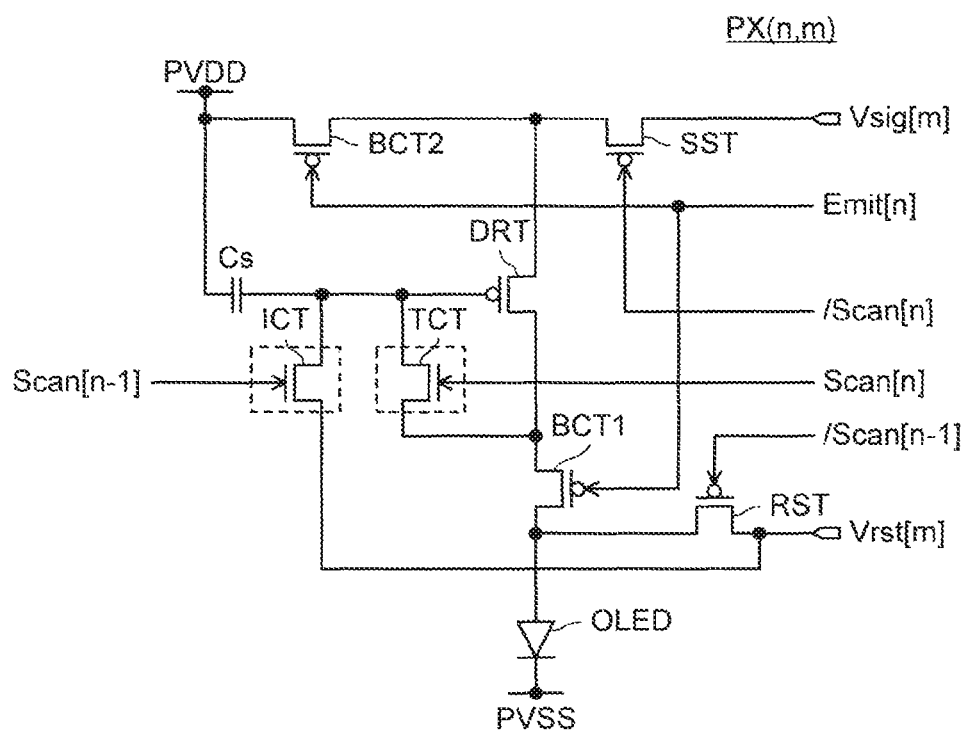
FIG. 3A and FIG. 3B are respectively an equivalent circuit and its timing chart of a pixel of a display device according to an embodiment of the present application.

FIG. 3A is an equivalent circuit of the pixel circuit PX shown in FIG. 2. In this figure, the pixel circuit PX(n, m) located in the nth row and mth column of the matrix formed in the pixel region 108 is shown. The structures of other pixel circuits PX are the same as that of the pixel circuit PX(n,m).

As shown in FIG. 3A, the pixel circuit PX has a driving transistor DRT, a pixel transistor SST, a reset transistor RST, a first output transistor BCT1, a second output transistor BCT2, a first switching transistor TCT, a second switching transistor ICT, and a storage capacitor Cs in addition to the light-emitting element OLED. These transistors each have a gate and a pair of terminals, and the storage capacitor Cs has a pair of terminals.

One terminal (source) of the driving transistor DRT is connected, through the second output transistor BCT, to the high-potential power-source line supplied with the power-source potential PVDD. The other terminal (drain) of the driving transistor DRT is connected to an input terminal (anode) of the light-emitting element OLED through the first output transistor BCT1. An output terminal (cathode) of the light-emitting element OLED is connected to the common electrode supplied with the ground potential PVSS. Note that the ground potential PVSS is not necessarily a ground potential and may be a constant potential lower than the power-source potential PVDD.

The terminal of the driving transistor DRT is further connected to an input terminal of the image signal Vsig[m] through the pixel transistor SST. In addition, the input terminal of the light-emitting element OLED is connected to an input terminal of the reset signal Vrst[m] through the reset transistor RST.

The first switching transistor TCT is connected between the gate and the other terminal of the driving transistor DRT. That is, one terminal of the first switching transistor TCT is connected to the gate of the driving transistor DRT, and the other terminal thereof is connected to the other terminal of the driving transistor DRT. On the other hand, the second switching transistor ICT is connected between the gate of the driving transistor DRT and the input terminal of the reset signal Vrst[m]. That is, one terminal of the second switching transistor ICT is connected to the gate of the driving transistor DRT, and the other terminal thereof is connected to the input terminal of the reset signal Vrst[m].

The storage capacitor Cs is connected between the gate of the driving transistor DRT and the high-potential power-source line supplied with the power-source potential PVDD. Namely, one terminal of the storage capacitor Cs is connected to the gate of the driving transistor DRT, and the other terminal is connected to the high-potential power-source line supplied with the power-source potential PVDD.

One terminal and the other terminal of the first output transistor BCT1 are connected to the other terminal of the driving transistor DRT and the input terminal of the light-emitting element OLED, respectively. One terminal and the other terminal of the second output transistor BCT2 are connected to the high-potential power-source line supplied with the power-source potential PVDD and one terminal of the driving transistor DRT, respectively. One terminal and the other terminal of the pixel transistor SST are connected to the input terminal of the image signal Vsig[m] and one terminal of the driving transistor DRT, respectively.

Among the aforementioned transistors, the driving transistor DRT, the pixel transistor SST, the reset transistor RST, the first output transistor BCT1, and the second output transistor BCT2 may have a channel region including silicon. In the present embodiment, these transistors are each represented as p-channel type field-effect transistor. However, a part of them may be formed as a n-channel type field-effect transistor. Such an embodiment will be described later. Furthermore, the channel regions of these transistors may possess a variety of morphologies selected from a single-crystalline, a polycrystalline, a microcrystalline, and an amorphous morphology. For example, they may have a polycrystalline morphology (low-temperature polycrystalline silicon (LTPS)) obtained by crystalizing amorphous silicon at a relatively low temperature. In the present embodiment, an example is described where the channel regions of the driving transistor DRT, the pixel transistor SST, the reset transistor RST, the first output transistor BCT1, and the second output transistor BCT2 have polycrystalline silicon. Hereinafter, a field-effect transistor having silicon in a channel region is referred to as a silicon transistor. Particularly, a field-effect transistor having polycrystalline silicon in a channel region is referred to as a polysilicon transistor.

In contrast, the first switching transistor TCT and the second switching transistor ICT may have a channel region including an oxide semiconductor and function as a n-channel type field-effect transistor. The crystallinity of the channel regions of the first switching transistor TCT and the second switching transistor ICT is also not limited and may have a single-crystalline, a polycrystalline, a microcrystalline, or an amorphous morphology. Hereinafter, a field-effect transistor having an oxide semiconductor in a channel region is referred to as an oxide-semiconductor transistor. Oxide-semiconductor transistors are surrounded by dotted squares in FIG. 3A, FIG. 4A, FIG. 5A, FIG. 6A, FIG. 7A, FIG. 8A, FIG. 9A, FIG. 10A, FIG. 11A, and FIG. 12A.

The gate of the first switching transistor TCT is supplied with the scanning signal Scan[n]. On the other hand, the gate of the second switching transistor ICT is supplied with the scanning signal Scan[n−1] corresponding to the pixel circuit PX positioned in the (n−1) row. The gates of the pixel transistor SST and the reset transistor RST are supplied with the inverted signal /Scan[n] of the scanning signal Scan[n] and the inverted signal /Scan[n−1] of the scanning signal Scan[n−1], respectively, and the gates of the first output transistor BCT1 and the second output transistor BCT2 are commonly supplied with the emit signal Emit[n].

Figure 3B:
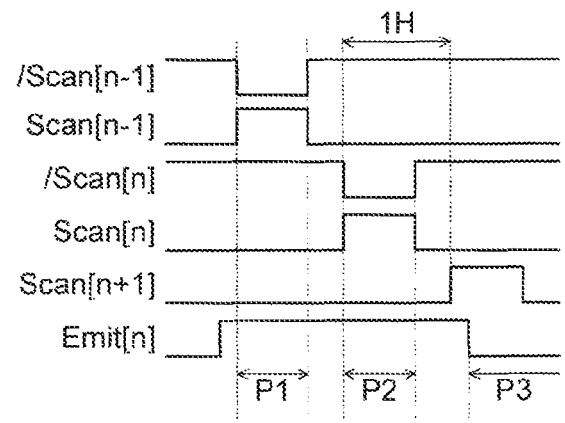

FIG. 3B is a timing chart showing change with time of each signal shown in FIG. 3A. Hereinafter, operation of the pixel circuits PX is explained with reference to this figure. Note that the following explanation is given for the case where a high level corresponds to an active state. However, whether a high level or a low level is called an active state is arbitrarily determined for each signal.

As shown in FIG. 3B, the scanning signal Scan[n] is sequentially pulse-activated from n=1 to n=N with an interval of a horizontal scanning period H. Each activation period is shorter than a time length of the horizontal scanning period H. When focus is placed on the pixel circuit PX(n, m), the second switching transistor ICT and the reset transistor RST first become an on state by activating the scanning signal Scan[n−1] and deactivating the inverted signal /Scan[n−1] of the scanning signal Scan[n−1] (reset period P1). At this time, the first switching transistor TCT and the pixel transistor SST are each in an off state because the scanning signal Scan[n] is in a deactivated state and the inverted signal /Scan[n] of the scanning signal Scan[n] is in an activated state. Furthermore, the emit signal Emit[n] is activated before the scanning signal Scan[n−1] is activated, and its activated state is maintained until the scanning signal Scan[n+1] is activated. Thus, the first output transistor BCT1 and the second output transistor BCT2 are off in the reset period P1.

Thus, only the second switching transistor ICT and the reset transistor RST are on in the reset period P1, and the reset signal Vrst[m] is supplied to the gate of the driving transistor DRT. With this operation, the potential of the gate (gate potential) of the driving transistor DRT is reset to Vrst[m]. Additionally, the potential difference between the terminals of the storage capacitor Cs is reset to PVDD−Vrst[m].

Next, the scanning signal Scan[n] is activated by which the first switching transistor TCT becomes an on state (writing period P2). At this time, the reset transistor RST is turned off and the pixel transistor SST is turned on because the inverted signal /Scan[n] of the scanning signal Scan[n] is deactivated and the inverted signal /Scan[n−1] of the scanning signal Scan[n−1] is activated. On the other hand, the second switching transistor ICT is turned off because the scanning signal Scan[n−1] is in a deactivated state, and the first output transistor BCT1 and the second output transistor BCT2 are turned off because the emit signal Emit[n] continuously maintains an activated state.

In the writing period P2, the image signal Vsig[m] is supplied to one terminal (source) of the driving transistor DRT, and the potentials of the gate and the other terminal (drain) of the driving transistor DRT each become Vsig[m]−Vth(n, m). Here, Vth(n, m) is a threshold voltage of the driving transistor DRT in the pixel circuit PX(n, m). At this time, the potential difference between the terminals of the storage capacitor Cs becomes PVDD−(Vsig[m]−Vth(n, m)).

Next, the emit signal Emit[n] is deactivated by which the first output transistor BCT1 and the second output transistor BCT2 are turned on (output period P3). Furthermore, the pixel transistor SST, the reset transistor RST, the first switching transistor TCT, and the second switching transistor ICT are each turned off. With this operation, the potential of the gate (gate potential) of the driving transistor DRT becomes substantially the same as Vsig[m] so that the influence of Vth(n, m) is canceled from the gate potential of the driving transistor DRT. Hence, intensity of a drain current of the driving transistor DRT becomes a value corresponding to Vsig[m], allowing the light-emitting element OLED to emit light at an intensity corresponding to Vsig[m]. With this operation, light emission at the intensity corresponding to the image signal Vsig[m] is realized.

In order to allow the light-emitting element OLED to continue emitting light at a constant intensity, it is necessary to maintain the gate potential of the driving transistor DRT at Vsig[m] during light emission of the light-emitting element OLED (i.e., over one frame). This is because the gate potential of the driving transistor DRT is gradually decreased due to an off current of the first switching transistor TCT and the second switching transistor ICT. It is possible to maintain the gate potential of the driving transistor DRT at Vsig[m] by compensating the decrease in potential with the storage capacitor Cs. However, an increase in pixel resolution limits electrostatic capacity of the storage capacitor Cs, which makes it difficult to compensate the decrease in potential using only the storage capacitor Cs.

According to the present embodiment, the channel regions of the first switching transistor TCT and the second switching transistor ICT each may have an oxide semiconductor as mentioned above. A leak current of an oxide-semiconductor transistor is low compared with that of a silicon transistor. Therefore, even if electrostatic capacity of the storage capacitor Cs is low or even if the storage capacitor Cs is not provided, the decrease of the gate potential of the driving transistor DRT can be suppressed. Since this structure allows the light-emitting element OLED to continue emitting light at a constant intensity, flicker and vertical cross talk can be suppressed and a high-quality image can be obtained. Additionally, a writing frequency of the image signal Vsig can be decreased because the gate potential of the driving transistor DRT can be maintained for a long time, thereby reducing power consumption of the display device 100.

Note that it is possible to reduce an area of the pixel circuit when the transistors other than the first and second switching transistors TCT and ICT of the present embodiment are prepared with polycrystalline silicon. Moreover, when the scanning-line driver circuits 102 and the data-line driver circuit 104 are formed as a peripheral circuit with n-channel type oxide-semiconductor transistors and p-channel type polysilicon transistors, process costs can be decreased because the manufacturing process of the n-channel type polysilicon transistors is not necessary. In addition, when the scanning-line driver circuits 102 and the data-line driver circuit 104 are formed with n-channel type and p-channel type polysilicon transistors, an area of the peripheral circuit can be reduced, by which a frame region can be decreased.

Second Embodiment

Figure 4A:
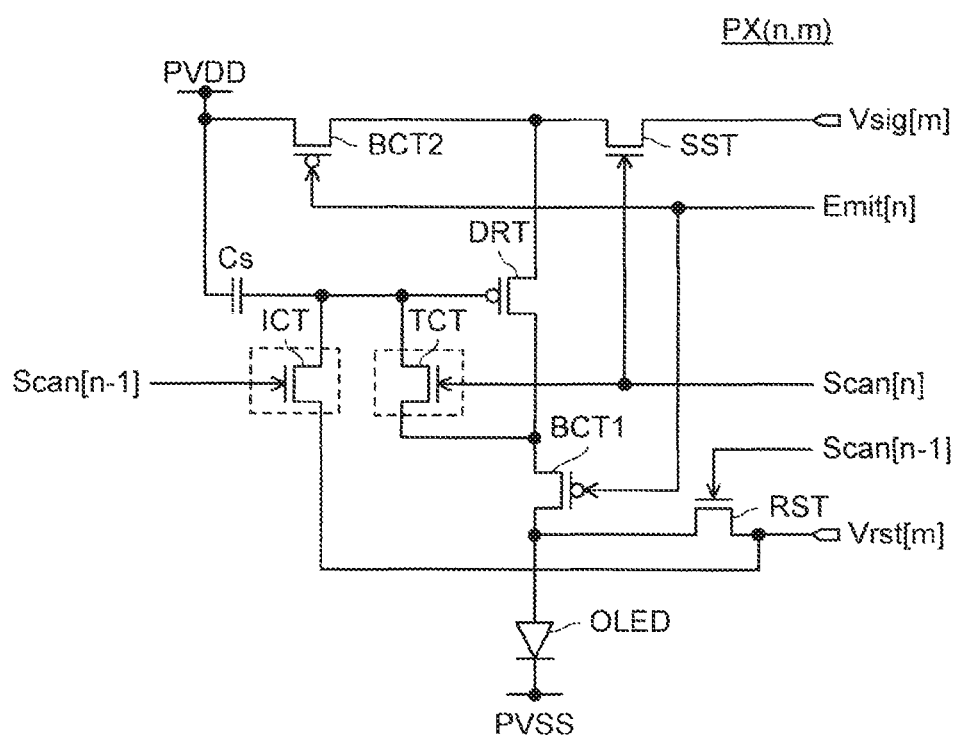
FIG. 4A and FIG. 4B are respectively an equivalent circuit and its timing chart of a pixel of a display device according to an embodiment of the present application.
Figure 4B:
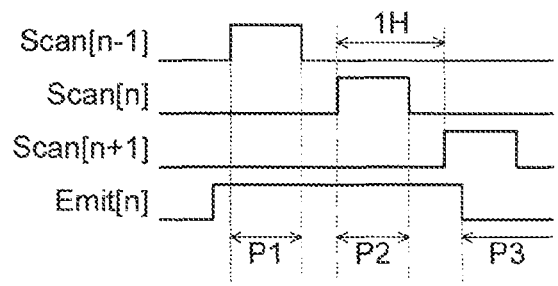

In the present embodiment, a pixel circuit PX having a structure different from that of the First Embodiment and a display device having the same are explained by using FIG. 4A and FIG. 4B. FIG. 4A is an equivalent circuit of the pixel circuit PX according to the Second Embodiment of the present invention, and FIG. 4B is a timing chart showing change with time of each signal shown in FIG. 4A. Explanation of the structures the same as or similar to those of the First Embodiment may be omitted.

As can be understood by comparing FIG. 4A and FIG. 4B with FIG. 3A and FIG. 3B, respectively, the pixel circuit PX of the present embodiment is different from that of the First Embodiment in that the channel types of the reset transistor RST and the pixel transistor SST are each an n-channel type, and that the scanning signal Scan[n−1] and the scanning signal Scan[n] are supplied to the gate of the reset transistor RST and the gate of the pixel transistor SST, respectively.

According to the present embodiment, the same operation as that of the display device 100 of the First Embodiment can be realized by supplying the gate of the reset transistor RST with the scanning signal Scan[n−1] and supplying the gate of the pixel transistor SST with the scanning signal Scan[n] which is also applied to the gate of the first switching transistor TCT as shown in FIG. 4A. Since the inverted signal /Scan[n] of the scanning signal Scan[n] becomes unnecessary, the wiring for supplying the inverted signal /Scan[n] to each pixel circuit PX from the scanning-line driver circuit 102 is not required (see FIG. 2). Hence, according to the present embodiment, it is possible to not only maintain the same effect as that of the First Embodiment that the decrease of the gate potential of the driving transistor DRT can be suppressed even if electrostatic capacitance of the storage capacitor Cs is small or even if the storage capacitor Cs is not provided but also obtain an effect that the display device 100 can be miniaturized. Additionally, similar to the First Embodiment, the gate potential of the driving transistor DRT can be maintained for a long time by the first switching transistor TCT and the second switching transistor ICT which are oxide-semiconductor transistors. Thus, a writing frequency of the image signal Vsig can be decreased, thereby reducing power consumption of the display device 100.

Note that it is also possible to reduce an area of the pixel circuit when the transistors other than the first and second switching transistors TCT and ICT are prepared with polycrystalline silicon in the present embodiment. In addition, when the scanning-line driver circuits 102 and the data-line driver circuit 104 are formed with n-channel type and p-channel type polysilicon transistors, an area of the peripheral circuit can be reduced, by which a frame region can be decreased.

Third Embodiment

Figure 5A:
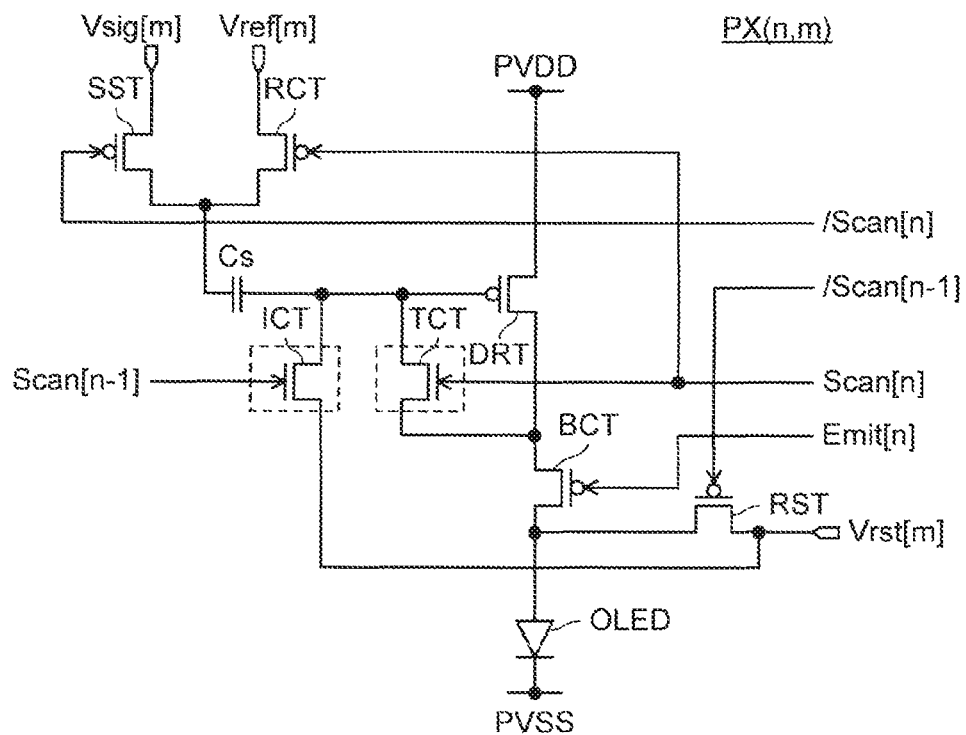
FIG. 5A and FIG. 5B are respectively an equivalent circuit and its timing chart of a pixel of a display device according to an embodiment of the present application.
Figure 5B:
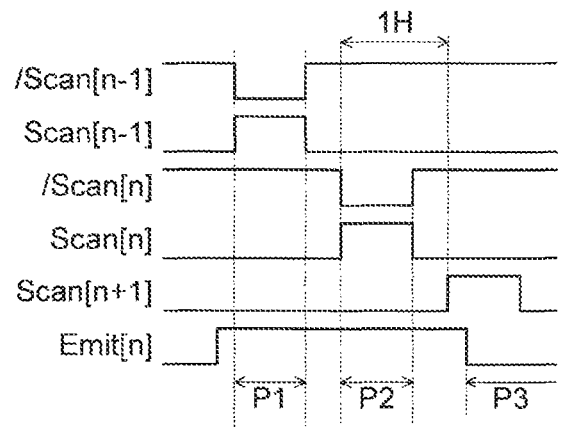

In the present embodiment, a pixel circuit PX having a structure different from those of the First and Second Embodiments and a display device having the same are explained by using FIG. 5A and FIG. 5B. FIG. 5A is an equivalent circuit of the pixel circuit PX according to the Third Embodiment of the present invention, and FIG. 5B is a timing chart showing change with time of each signal shown in FIG. 5A. Explanation of the structures the same as or similar to those of the First and Second Embodiments may be omitted.

As can be understood by comparing FIG. 5A and FIG. 5B with FIG. 4A and FIG. 4B, respectively, the pixel circuit PX of the present embodiment is different from that of the First Embodiment in that the image signal Vsig[m] is input to the gate of the driving transistor DRT. Specifically, as shown in FIG. 5A, a specific structure of the pixel circuit PX according to the present embodiment is different from that of the pixel circuit PX of the First Embodiment in that a reference transistor RCT having a gate and a pair of terminals is added while the second output transistor BCT2 is not provided. Note that in this and following embodiments the first output transistor BCT1 may be simply referred to as an output transistor BCT.

One terminal of the driving transistor DRT is directly connected to the high-potential power-source line supplied with the power-source potential PVDD in the present embodiment. Furthermore, the other terminal of the storage capacitor Cs is connected to one terminal of the pixel transistor SST and one terminal of the reference transistor RCT. The other terminal of the pixel transistor SST is connected to the input terminal of the image signal Vsig[m], and the other terminal of the reference transistor RCT is connected to an input terminal of a reference signal Vref[m]. The gate of the reference transistor RCT is supplied with the scanning signal Scan[n] which is commonly applied to the gate of the first switching transistor TCT. Note that, although the reference signal Vref[m] is not illustrated in FIG. 2, the reference signal Vref[m] is a signal which is commonly supplied to the pixel circuits PX in the mth column from the data-line driver circuit 104, similar to the image signal Vsig[m].

Similar to the driving transistor DRT, the pixel transistor SST, the reset transistor RST, and the output transistor BCT, the reference transistor RCT may be a p-channel type field-effect transistor having a channel region including silicon.

Operation of the pixel circuit PX(n, m) of this modified example is explained by using a timing chart shown in FIG. 5B. As shown in FIG. 5B, the scanning signal Scan[n] and its inverted signal /Scan[n] are sequentially pulse-activated from n=1 to n=N with a predetermined interval of the horizontal scanning period H.

First, the scanning signal Scan[n−1] and its inverted signal /Scan[n−1] of the preceding row are respectively activated and deactivated in the reset period P1 of the pixel PX(n, m). Activation of Scan[n−1] turns on the second switching transistor ICT, and deactivation of the scanning signal /Scan[n−1] also turns on the reset transistor RST. The reference transistor RCT maintains an on state, and the first switching transistor TCT maintains an off state because the scanning signal Scan[n] is in a deactivated state prior to the reset period P1. On the contrary, the pixel transistor SST maintains an off state because the scanning signal /Scan[n] is in an activated state. Similarly, the output transistor BCT maintains an off state because the emit signal Emit[n] is activated prior to the reset period P1.

Since the second switching transistor ICT, the reset transistor RST, and the reference transistor RCT are each in an on state in the reset period P1, the gate of the driving transistor DRT and the anode of the light-emitting element OLED are provided with Vrst[m] through the second switching transistor ICT and the reset transistor RCT, respectively, so as to be reset. One terminal of the storage capacitor Cs is provided with Vrst[m] through the second switching transistor ICT, and the other terminal is provided with Vref[m] through the reference transistor RCT.

At a stage when the reset period P1 is completed and the following writing period P2 is started, the scanning signal Scan[n−1] is deactivated, its inverted signal /Scan[n−1] is activated, Scan[n] is activated, and its inverted signal /Scan[n] is deactivated as shown in FIG. 5B. As a result, the second switching transistor ICT, the reset transistor RST, and the reference transistor RCT change to an off state, and the pixel transistor SST and the first switching transistor TCT change to an on state. The output transistor BCT maintains an off state because the emit signal Emit[n] keeps an activated state. Each of the potentials of the gate and the drain of the driving transistor DRT changes to PVDD−Vth(n, m) because the source of the driving transistor DRT is directly connected to the high-potential power-source line.

On the other hand, Vsig[m] is supplied to the other terminal of the storage capacitor Cs. Therefore, the potential difference between the terminals of the storage capacitor Cs becomes Vsig−(PVDD−Vth(n, m)).

At a stage when the writing period P2 is completed and the following output period P3 is started, the scanning signal Scan[n] is deactivated and its inverted signal /Scan[n] is activated as shown in FIG. 5B. As a result, the pixel transistor SST and the first switching transistor TCT change to an off state, while the reference transistor RCT and the output transistor BCT change to an on state. The other terminal of the storage capacitor Cs is electrically connected to the input terminal of the reference signal Vref[m] and provided with Vref[m]. Since the potential difference Vsig−(PVDD−Vth(n, m)) between the terminals in the writing period P2 is maintained, the potential of one terminal of the storage capacitor Cs and the gate potential of the driving transistor DRT in the output period P3 become Vref−(Vsig−(PVDD−Vth(n, m))), i.e., Vref−Vsig+PVDD−Vth(n, m). Since the potential of the drain of the driving transistor DRT in the writing period P2 is PVDD−Vth(n, m), a voltage Vgs between the gate and the source of the driving transistor DRT in the output period P3 is (Vref−Vsig+PVDD−Vth(n, m))−(PVDD−Vth(n, m)), i.e., Vref−Vsig, and does not depend on Vth(n, m).

Thus, the driving transistor DRT can be driven at a voltage from which the threshold Vth(n, m) is canceled. Since the light-emitting element OLED can be driven with a current independent from Vth(n, m) in the absence of the influence of variation in threshold voltage Vth(n, m), the variation in luminance between the pixel circuits PX(n, m) can be suppressed, and a high-quality image can be reproduced.

In the pixel circuit PX of the present embodiment and the display device 100 having the pixel circuit PX, the channel regions of the first switching transistor TCT and the second switching transistor ICT which are connected to the gate of the driving transistor DRT may also contain an oxide semiconductor. Therefore, similar to the First Embodiment, even if electrostatic capacity of the storage capacitor Cs is low or even if the storage capacitor Cs is not provided, the decrease of the gate potential of the driving transistor DRT can be suppressed. Additionally, a writing frequency of the image signal Vsig can be decreased because the gate potential of the driving transistor DRT can be maintained for a long time with the first switching transistor TCT and the second switching transistor ICT which are oxide-semiconductor transistors, thereby reducing power consumption of the display device 100.

Note that it is possible to reduce an area of the pixel circuit when the transistors other than the first and second switching transistors TCT and ICT of the present embodiment are prepared with polycrystalline silicon. Moreover, when the scanning-line driver circuits 102 and the data-line driver circuit 104 are formed with n-channel type oxide-semiconductor transistors and p-channel type polysilicon transistors, process costs can be decreased because the manufacturing process of the n-channel type polysilicon transistors is not necessary. In addition, when the scanning-line driver circuits 102 and the data-line driver circuit 104 are formed with n-channel type and p-channel type polysilicon transistors, an area of the peripheral circuit can be reduced, by which a frame region can be decreased.

Fourth Embodiment

Figure 6A:
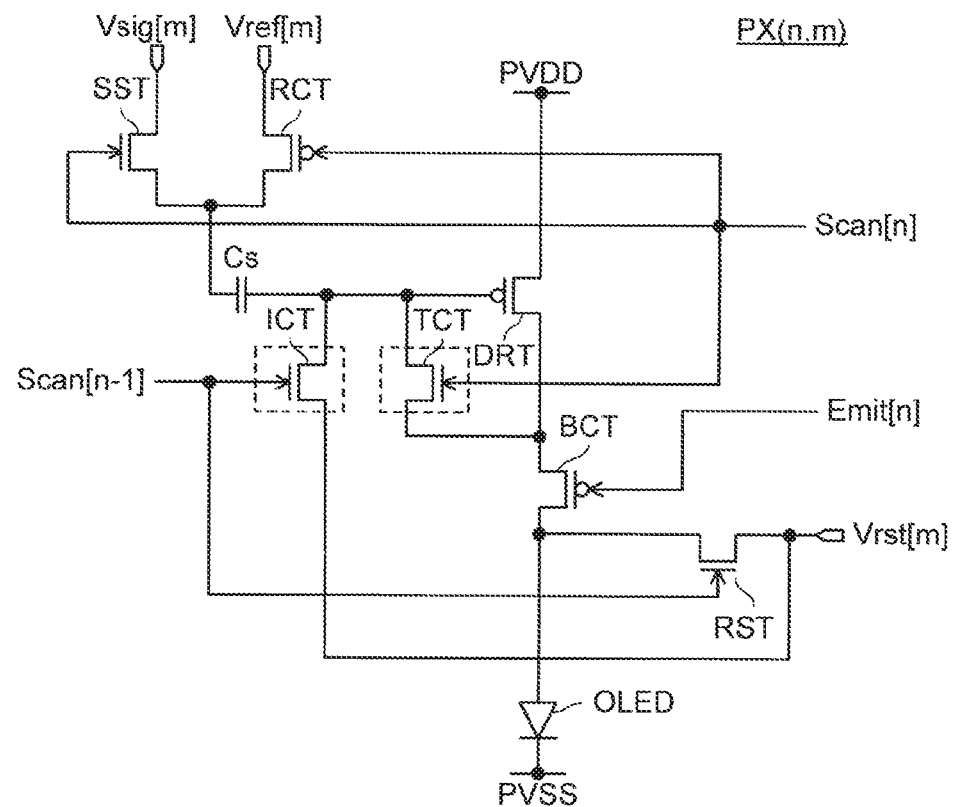
FIG. 6A and FIG. 6B are respectively an equivalent circuit and its timing chart of a pixel of a display device according to an embodiment of the present application.
Figure 6B:
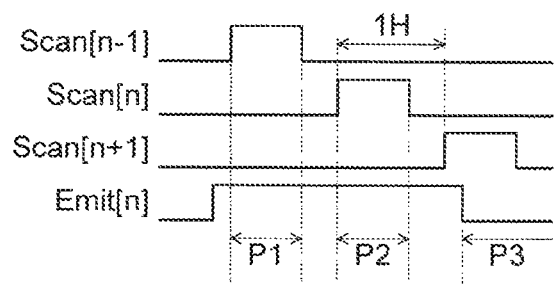

In the present embodiment, a pixel circuit PX having a structure different from those of the First to Third Embodiments and a display device having the same are explained by using FIG. 6A and FIG. 6B. Explanation of the structures the same as or similar to those of the First to Third Embodiments may be omitted.

FIG. 6A is an equivalent circuit of the pixel circuit PX according to the Fourth Embodiment of the present invention, and FIG. 6B is a timing chart showing change with time of each signal shown in FIG. 6A.

As can be understood by comparing FIG. 6A and FIG. 6B with FIG. 5A and FIG. 5B, respectively, the pixel circuit PX of the present embodiment is different from that of the Third Embodiment in that the channel types of the reset transistor RST and the pixel transistor SST are each an n-channel type, the scanning signal [n−1] is supplied to the gate of the reset transistor RST, and the scanning signal [n] is supplied to the gate of the pixel transistor SST. Therefore, the operation the same as that of the display device 100 of the Third Embodiment can be realized. As a result, since the inverted signal /Scan[n] of the scanning signal Scan[n] becomes unnecessary, the wiring for supplying the inverted signal /Scan[n] to each pixel circuit PX from the scanning-line driver circuit 102 is not necessary (see FIG. 2). Hence, according to the present embodiment, it is possible to not only maintain the same effect as that of the Third Embodiment that is suppress a decrease of the gate potential of the driving transistor DRT even in the case where electrostatic capacitance of the storage capacitor Cs is small or the storage capacitor Cs is not provided but also obtain an effect that the display device 100 can be miniaturized. Additionally, the gate potential of the driving transistor DRT can be maintained for a long time by the first switching transistor TCT and the second switching transistor ICT which are oxide-semiconductor transistors. Thus, a writing frequency of the image signal Vsig can be decreased, thereby reducing power consumption of the display device 100.

Note that, in the present embodiment, it is also possible to reduce an area of the pixel circuit when the transistors other than the first and second switching transistors TCT and ICT are prepared with polycrystalline silicon. In addition, when the scanning-line driver circuits 102 and the data-line driver circuit 104 are formed with n-channel type and p-channel type polysilicon transistors, an area of the peripheral circuit can be reduced, by which a frame region can be decreased.

Fifth Embodiment

Figure 7A:
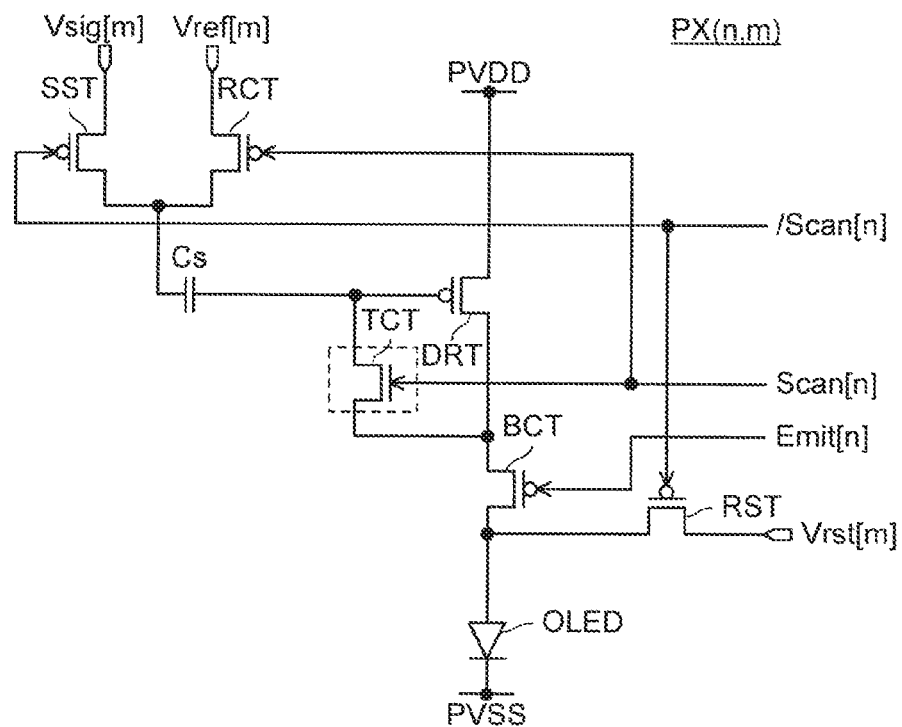
FIG. 7A and FIG. 7B are respectively an equivalent circuit and its timing chart of a pixel of a display device according to an embodiment of the present application.
Figure 7B:
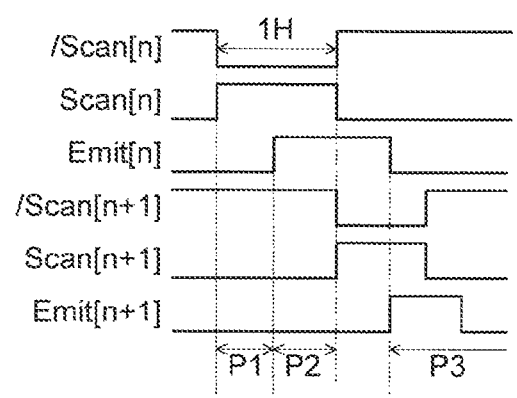

In the present embodiment, a pixel circuit PX having a structure different from those of the First to Fourth Embodiments and a display device having the same are explained by using FIG. 7A and FIG. 7B. Explanation of the structures the same as or similar to those of the First to Fourth Embodiments may be omitted.

FIG. 7A is an equivalent circuit of the pixel circuit PX according to the Fifth Embodiment of the present invention, and FIG. 7B is a timing chart showing change with time of each signal shown in FIG. 7A.

As can be understood by comparing FIG. 7A and FIG. 7B with FIG. 5A and FIG. 5B, respectively, the pixel circuit PX of the present embodiment is different from that of the Third Embodiment in that the second switching transistor ICT is not provided and the activation timing of the emit signal Emit[n] is after the activation of the corresponding scanning signal Scan[n]. Hereinafter, the pixel circuit PX of the present embodiment is explained in detail focusing on the differences.

In the present embodiment, a period after the scanning signal Scan[n] is activated and until the emit signal Emit[n]

is activated is the reset period P1 and a period after the emit signal Emit[n] is activated and until the scanning signal Scan[n] returns to a deactivated state is the writing period P2 as shown in FIG. 7B.

In the reset period P1, since the driving transistor DRT and the reference transistor RCT become an off state, and the reset transistor RST, the output transistor BCT, the first switching transistor TCT, and the pixel transistor SST become an on state, the reset signal Vrst[m] is supplied to the gate of the driving transistor DRT and one terminal of the storage capacitor Cs. Simultaneously, Vsig[m] is provided to the other terminal of the storage capacitor Cs. This state is the same as the state of the Third Embodiment shown in FIG. 5A and FIG. 5B where the second switching transistor ICT is turned on when the scanning signal Scan[n−1] is activated. Therefore, the gate potential of the driving transistor DRT and the potential difference between the terminals of the storage capacitor Cs are reset, and the potential difference between the terminals of the storage capacitor Cs becomes Vsig[m]−Vrst[m]. Here, when the potential of the reset signal Vrst[m] is 0 V, and the potential of the power-source potential PVDD is approximately 10 V, the potentials of the gate and the other terminal (drain) of the driving transistor DRT are determined by the potential difference therebetween. Hence, although the degree of the on state is not clearly determined, the driving transistor DRT is in an off state but exists in an on state to some extent or a state close to an on state.

In the writing period P2, the scanning signal Scan[n] and the inverted signal /Scan[n+1] of the scanning signal Scan [n+1] maintain an activated state, and the inverted signal /Scan[n] of the scanning signal Scan[n] and the scanning signal Scan[n+1] maintain a deactivated state, while the emit signal Emit[n] is activated. Therefore, the driving transistor DRT, the reference transistor RCT, and the output transistor BCT are turned off, and the reset transistor RST, the first switching transistor TCT, and the pixel transistor SST maintain an on state. The change of the output transistor BCT to an off-state results in an increase of the potentials of the gate and the other terminal (drain) of the driving transistor DRT and one terminal of the storage capacitor Cs to PVDD−Vth (n, m). Hence, the potential difference between the terminals of the storage capacitor Cs becomes Vsig[m]−(PVDD−Vth (n, m)).

In a period after the writing period P2 is completed and before the output period P3 is started, the scanning signal Scan[n] and the inverted signal /Scan[n+1] of the scanning signal Scan[n+1] are deactivated, while the inverted signal /Scan[n] of the scanning signal Scan[n] and the scanning signal Scan[n+1] are activated. With this operation, the first switching transistor TCT the pixel transistor SST, and the reset transistor RST are switched to an off state, and the reference transistor RCT is switched to an on state. As a result, the reference signal Vref[m] is supplied to the other terminal of the storage capacitor Cs. In the writing period P2 immediately before this period, the potential of the gate of the driving transistor DRT becomes PVDD−Vth(n, m), and the potential difference between the terminals of the storage capacitor Cs is maintained. Hence, the potential of the gate of the driving transistor DRT is changed to Vref[m] −(Vsig [m]−(PVDD−Vth(n, m)), i.e., Vref[m]−Vsig[m]+PVDD−Vth(n, m) due to coupling. On the other hand, since the first switching transistor TCT is in an off state, the potential of the other terminal (drain) of the driving transistor DRT is PVDD−Vth(n, m). Therefore, the potential difference between the gate and the other terminal (drain) of the driving transistor DRT becomes Vref[m]−Vsig[m] and does not include Vth(n, m). In other words, the potential difference between the gate and the other terminal (drain) of the driving transistor DRT does not depend on Vth(n, m).

In the following output period P3, the emit signal Emit[n] is deactivated, and the first switching transistor TCT shifts to an on state. As a result, a current dependent on the potential difference Vref[m]−Vsig[m] between the gate and the other terminal (drain) flows in the driving transistor DRT, and this current is supplied to the light-emitting element OLED.

Thus, the driving transistor DRT can be driven with a voltage from which the threshold Vth(n, m) is canceled. Since the light-emitting element OLED can be driven with a current independent from Vth(n, m) without any influence of the variation in threshold Vth(n, m), variation in luminance can be suppressed between the pixel circuits PX(n, m), and a high-quality image can be reproduced.

Similar to the Third Embodiment, it is also possible to obtain the effect that the decrease of the gate potential of the driving transistor DRT can be suppressed even if electrostatic capacitance of the storage capacitor Cs is small or even if the storage capacitor Cs is not provided in the present embodiment. Additionally, the gate potential of the driving transistor DRT can be maintained for a long time by the first switching transistor TCT which is an oxide-semiconductor transistor. Thus, a writing frequency of the image signal Vsig can be decreased, thereby reducing power consumption of the display device 100.

Note that, an area of the pixel circuit can be reduced when the transistors other than the first switching transistor TCT are prepared with polycrystalline silicon. In addition, when the scanning-line driver circuits 102 and the data-line driver circuit 104 are formed with n-channel type oxide-semiconductor transistors and p-channel type polysilicon transistors, process costs can be decreased because the manufacturing process of the n-channel type polysilicon transistors is not necessary. In addition, when the scanning-line driver circuits 102 and the data-line driver circuit 104 are formed with n-channel type and p-channel type polysilicon transistors, an area of the peripheral circuit can be reduced, by which a frame region can be decreased.

Sixth Embodiment

Figure 8A:
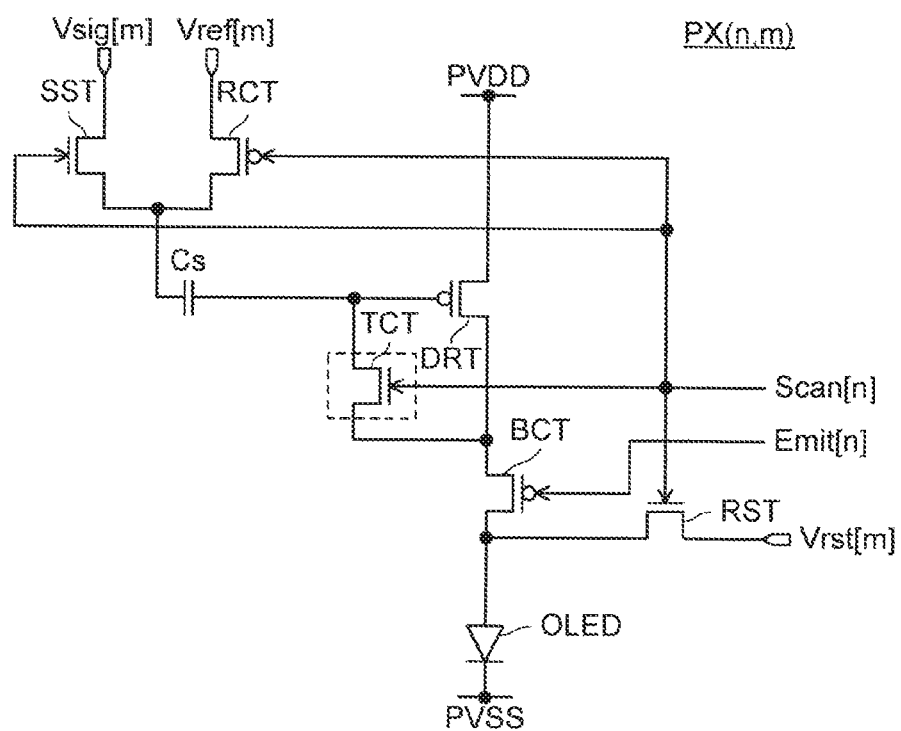
FIG. 8A and FIG. 8B are respectively an equivalent circuit and its timing chart of a pixel of a display device according to an embodiment of the present application.
Figure 8B:
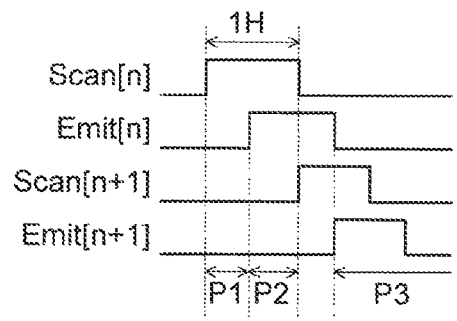

In the present embodiment, a pixel circuit PX having a structure different from those of the First to Fifth Embodiments and a display device having the same are explained by using FIG. 8A and FIG. 8B. Explanation of the structures the same as or similar to those of the First to Fifth Embodiments may be omitted. FIG. 8A is an equivalent circuit of the pixel circuit PX according to the Sixth Embodiment of the present invention, and FIG. 8B is a timing chart showing change with time of each signal shown in FIG. 8A.

As can be understood by comparing FIG. 8A and FIG. 8B with FIG. 7A and FIG. 7B, respectively, the pixel circuit PX of the present embodiment is different from that of the Fifth Embodiment in that the channel types of the reset transistor RST and the pixel transistor SST are each an n-channel type, and the scanning signal Scan[n] is supplied to the gates of the reset transistor RST and the pixel transistor SST. Therefore, the operation the same as that of the display device 100 of the Fifth Embodiment can be realized. As a result, since the inverted signal /Scan[n] of the scanning signal Scan[n] becomes unnecessary, the wiring for supplying the inverted signal /Scan[n] to each pixel circuit PX from the scanning-line driver circuit 102 is not necessary (see FIG. 2). Hence, according to the present embodiment, it is possible to not only maintain the same effect as that of the Fifth Embodiment that the decrease of the gate potential of the driving transistor EMT can be suppressed even if electrostatic capacitance of the storage capacitor Cs is small or even if the storage capacitor Cs is not provided but also obtain an effect that the display device 100 can be miniaturized. Additionally, the gate potential of the driving transistor DRT can be maintained for a long time by the first switching transistor TCT which is an oxide-semiconductor transistor. Thus, a writing frequency of the image signal Vsig can be decreased, thereby reducing power consumption of the display device 100.

Note that, in the present embodiment, it is also possible to reduce an area of the pixel circuit when the transistors other than the first and second switching transistors TCT and ICT are prepared with polycrystalline silicon. In addition, when the scanning-line driver circuits 102 and the data-line driver circuit 104 are formed with n-channel type and p-channel type polysilicon transistors, an area of the peripheral circuit can be reduced, by which a frame region can be decreased.

Seventh Embodiment

Figure 9A:
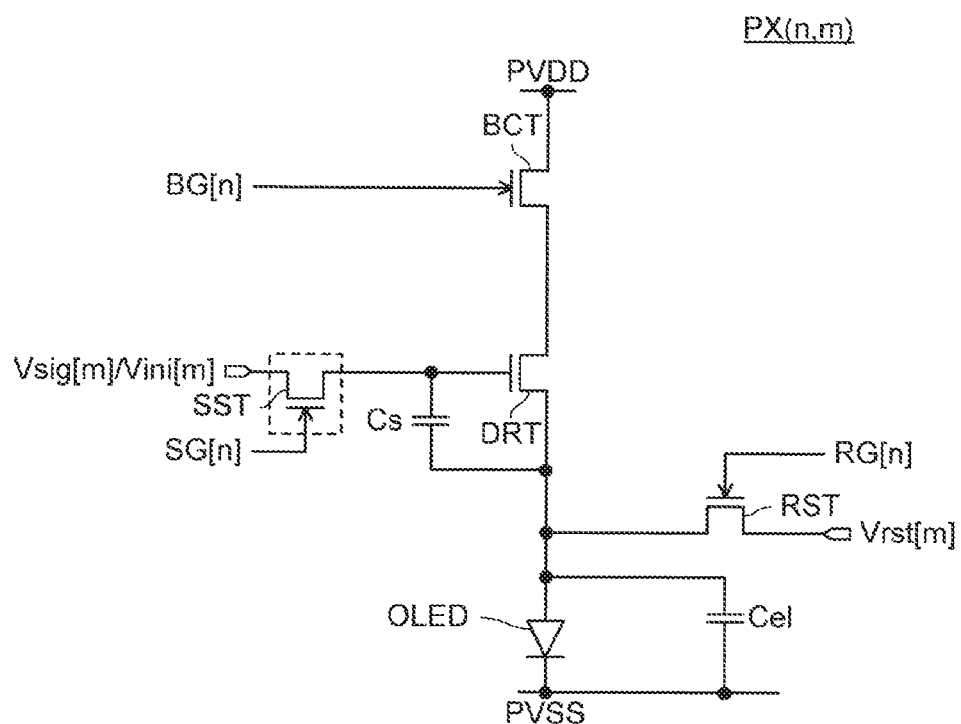
FIG. 9A and FIG. 9B are respectively an equivalent circuit and its timing chart of a pixel of a display device according to an embodiment of the present application.
Figure 9B:
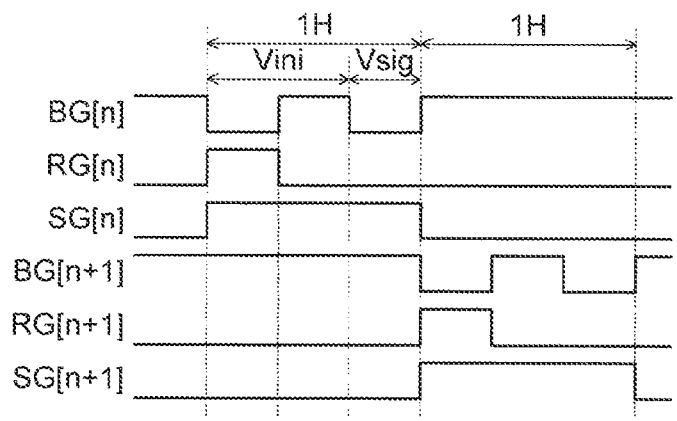

FIG. 9A is an equivalent circuit of the pixel circuit PX according to the Seventh Embodiment of the present invention, and FIG. 9B is a timing chart showing change with time of each signal shown in FIG. 9A.

In the present embodiment, a pixel circuit PX having a structure different from those of the First to Sixth Embodiments and a display device having the same are explained by using FIG. 9A and FIG. 9B. Explanation of the structures the same as or similar to those of the First to Sixth Embodiments may be omitted.

As can be understood by comparing FIG. 9A and FIG. 9B with the corresponding figures from FIG. 2 to FIG. 7B, the pixel circuit PX of the present embodiment is different from those of the First to Sixth Embodiments in that the driving transistor DRT is a n-channel type transistor. The outline structure of the circuit and the signals used are also different due to this difference. Hereinafter, the pixel circuit PX of the present embodiment is explained in detail focusing on the differences.

As shown in FIG. 9A, the pixel circuit PX of the present embodiment possesses the light-emitting element OLED, the driving transistor DRT, the pixel transistor SST, the reset transistor RST, the output transistor BCT, the storage capacitor Cs, and a supplementary capacitor Cel. Note that when capacitance of the light-emitting element OLED is sufficiently large, the supplementary capacitor Cel may not be provided.

One terminal (drain) of the driving transistor DRT is connected, through the output transistor BCT, to the high-potential power-source line supplied with the power-source potential PVDD. The other terminal (drain) of the driving transistor DRT is connected to the input terminal of the light-emitting element OLED and one terminal of the supplementary capacitor Cel. The output terminal of the light-emitting element OLED and the other terminal of the supplementary capacitance Cel are connected to the common electrode supplied with the ground potential PVSS.

The input terminal of the light-emitting element OLED is also connected to the input terminal of the reset signal Vrst[m] shown in FIG. 2 through the reset transistor RST. That is, one terminal of the reset transistor RST is connected to the input terminal of the light-emitting element OLED and the other terminal thereof is connected to the input terminal of the reset signal Vrst[m].

The pixel transistor SST is connected between the input terminal of the image signal Vsig[m] and the gate of the driving transistor DRT. Namely, one terminal of the pixel transistor SST is connected to the input terminal of the image signal Vsig[m], and the other terminal thereof is connected to the gate of the driving transistor DRT.

Here, the data-line driver circuit 104 (FIG. 2) of the present embodiment is configured to supply an initialization signal Vini[m] to the same wiring as that of the image signal Vsig[m] in a time-division manner. Therefore, the input terminal of the image signal Vsig[m] also serves as an input terminal of the initialization signal Vini[m].

The storage capacitor Cs is connected between the gate of the driving transistor DRT and the other terminal (the terminal connected to the input terminal of the light-emitting element OLED). That is, one terminal of the storage capacitor Cs is connected to the gate of the driving transistor DRT, and the other terminal thereof is connected to the other terminal of the driving transistor DRT.

In the present embodiment, the driving transistor DRT, the reset transistor RST, and the output transistor BCT each may be an n-channel type field-effect transistor including a channel region containing silicon such as LTPS. On the other hand, the pixel transistor SST may be an n-channel type field-effect transistor including a channel region containing an oxide semiconductor.

The scanning-line signal circuit 102 of the present embodiment (FIG. 2) is configured to supply control signals BG[n], RG[n], and SG[n] instead of the scanning signal Scan[n], the inverted signal /Scan[n] of the scanning signal S[n], and the emit signal Emit[n]. The gate of the output transistor BCT is supplied with the control signal BG[n], the gate of the reset transistor RST is supplied with the control signal RG[n], and the gate of the pixel transistor SST is supplied with the control signal SG[n].

Hereinafter, operation of the pixel circuit PX in the nth row is explained with reference to the timing chart shown in FIG. 9B.

First, the control signals BG[n], RG[n], and SG[n] are switched to a deactivated state, an activated state, and a deactivated state so that a reset operation is started. With this operation, the pixel transistor SST and the reset transistor RST are turned on, and the output transistor BCT is turned off. At this time, the initialization signal Vini[m] is supplied to the gate of the driving transistor DRT and one terminal of the storage capacitor Cs through the pixel transistor SST. On the other hand, the reset signal Vrst[m] is supplied to the other terminal of the storage capacitor Cs, the other terminal (source) of the driving transistor DRT, the input terminal of the light-emitting element OLED, and one terminal of the supplementary capacitor Cel through the reset transistor RST. With these operations, the potential (Vg) of the gate of the driving transistor DRT and the potential difference between both terminals of the storage capacitor Cs are reset. At this time, a potential difference between the gate and the source of the driving transistor DRT becomes Vrst−Vini.

Next, the states of the control signals BG[n] and RG[n] are respectively changed to activated and deactivated states, respectively, while maintaining the state of the control signal SG[n] and continuing supply of the initialization signal Vini[m], by which the pixel transistor SST and the output transistor BCT become an on state, and the reset transistor RST becomes an off state. With this operation, a potential difference is generated and a current flows between the source and the drain of the driving transistor DRT. This current flows until a charge corresponding to the threshold Vth(n, m) of the driving transistor DRT is accumulated in the storage capacitor Cs, that is, until the source potential (Vs) of the driving transistor DRT becomes a potential lower than Vg by Vth(n, m) so that a steady state is reached. Therefore, Vs is Vini[m]−Vth(n, m) in the steady state. On the other hand, the potential difference $V_{gs}$ between the gate and the source becomes Vth(n, m) because Vg is maintained at Vini.

Next, supply of the image signal Vsig[m] is started instead of the initialization signal Vini[ ] and the state of the control signal BG[n] is switched to a deactivated state, while maintaining the states of the control signal RG[n] and the control signal SG[n]. With this operation, the pixel transistor SST becomes an on state, and the reset transistor RST and the output transistor BCT become an on state. As a result, the image signal Vsig[m] is supplied to the gate of the driving transistor DRT, which accompanies the change of Vs of the driving transistor DRT. This change is determined by capacitance distribution between the storage capacitor Cs and the supplementary capacitor Cel. More specifically, Vs is expressed by the following equation.

$$Vs = Vini[m] - Vth(n, m) + (Vsig[m] - Vini[m]) \times \frac{Cs}{Cs + Cel}$$

Finally, the states of the control signals BG[n], RG[n], and SG[n] are returned to the initial states, that is, they are returned to an activated sate, a deactivated state, and a deactivated state, respectively. With this operation, the output transistor BCT becomes an on state, and the reset transistor RST and the pixel transistor SST become an off state. At this time, the $V_{gs}$ of the driving transistor EMT becomes a value expressed by the following equation because Vg is Vsig[m].

$$Vgs = Vg - Vs$$
$$= Vsig[m] - \left\{ Vini[m] - Vth + (Vsig[m] - Vini[m]) \times \frac{Cs}{Cs + Cel} \right\}$$
$$= (Vsig[m] - Vini[m]) \times \frac{Cel}{Cs + Cel} + Vth(n, m)$$

On the other hand, a current Id flowing between the source and the drain of the driving transistor DRT is expressed by the following equation:

$$Id = \beta\{Vgs - Vth(n,m)\}^2$$

where the coefficient β is a gain.

Substitution of Vgs in this equation cancels Vth(n, m), which reveals that the current Id independent from the threshold voltage Vth(n, m) of the driving transistor DRT is supplied to the driving transistor DRT and the light-emitting element OLED. Therefore, the light-emitting element OLED can be driven with a current independent from the Vth(n, m) without influence of the variation in threshold voltage Vth(n, m), by which luminance variation between the pixel circuits PX(n, m) is suppressed and a high-quality image can be reproduced.

According to the present embodiment, the pixel transistor SST can be structured with an oxide-semiconductor transistor having a small leak current compared with that of a silicon transistor. Therefore, discharge of the charge accumulated in the driving transistor DRT through the pixel transistor SST can be prevented. Hence, similar to the First to Sixth Embodiments, it is possible to suppress a decrease of the gate potential of the driving transistor even if electrostatic capacitance of the storage capacitor Cs is small or even if the storage capacitor Cs is not provided. Additionally, the gate potential of the driving transistor DRT can be maintained for a long time by the first switching transistor TCT which is an oxide-semiconductor transistor. Thus, a writing frequency of the image signal Vsig can be decreased, thereby reducing power consumption of the display device 100.

Note that, it is possible to reduce an area of the pixel circuit when the transistors other than the pixel transistor SST are prepared with polycrystalline silicon. In addition, when the scanning-line driver circuits 102 and the data-line driver circuit 104 are formed with n-channel type and p-channel type polysilicon transistors, an area of the peripheral circuit can be reduced, by which a frame region can be decreased.

Eighth Embodiment

Figure 10A:
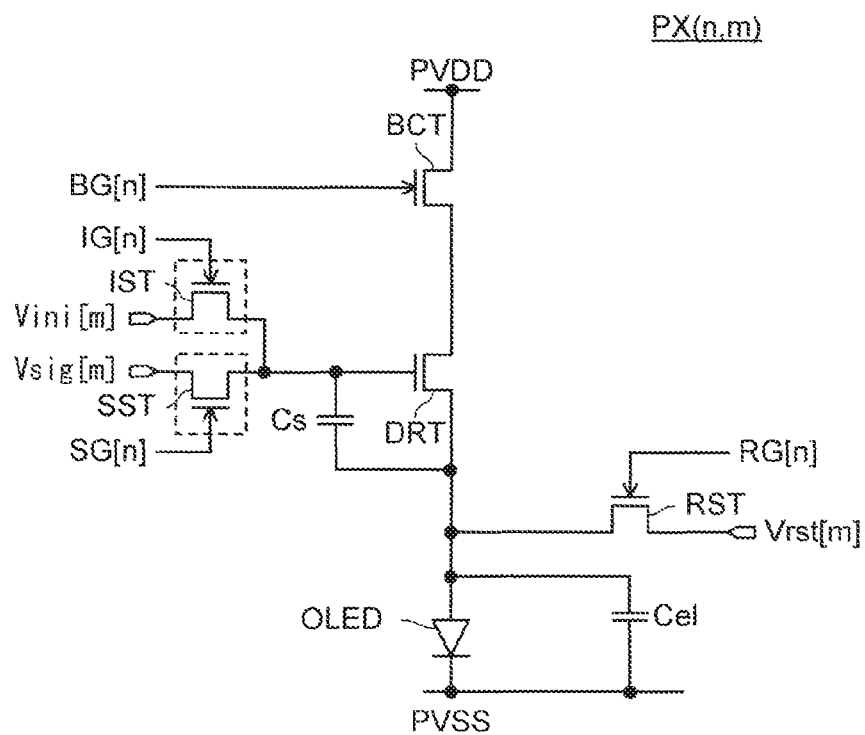
FIG. 10A and FIG. 10B are respectively an equivalent circuit and its timing chart of a pixel of a display device according to an embodiment of the present application.
Figure 10B:
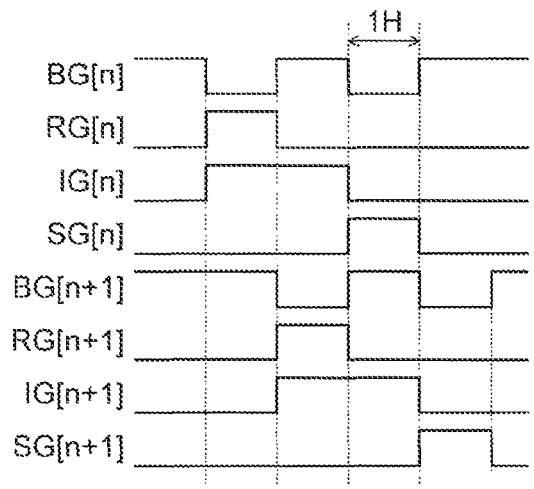

In the present embodiment, a pixel circuit PX having a structure different from those of the First to Seventh Embodiments and a display device having the same are explained by using FIG. 10A and FIG. 10B. Explanation of the structures the same as or similar to those of the First to Seventh Embodiments may be omitted.

FIG. 10A is an equivalent circuit of the pixel circuit PX according to the Eighth Embodiment of the present invention, and FIG. 10B is a timing chart showing change with time of each signal shown in FIG. 10A.

As can be understood by comparing FIG. 10A and FIG. 10B with FIG. 9A and FIG. 9B, respectively, the pixel circuit PX of the present embodiment is different from that of the Seventh Embodiments in that an initialization transistor IST is provided in parallel to the pixel transistor SST. Hereinafter, the pixel circuit PX of the present embodiment is explained in detail focusing on the differences.

Similar to the pixel transistor SST, the initialization transistor IST may have a channel region including an oxide semiconductor.

The data-line driver circuit 104 (FIG. 2) of the present embodiment is configured to supply the initialization signal Vini[m] to each pixel circuit PX by using a wiring (not shown) different from that used for the image signal Vsig [m]. One terminal of the initialization transistor IST is connected to an input terminal of this initialization signal Vini[m]. The other terminal of the initialization transistor IST is connected to the gate of the driving transistor DRT.

A gate of the initialization transistor IST is supplied with a control signal IG[n] from the scanning-line driver circuit 102 (FIG. 2). As can be understood by comparing FIG. 10B with FIG. 9B, the control signal IG[n] of the present embodiment is activated in the period in which the initialization signal Vini[m] is supplied from the scanning-line driver circuit 102 in the case of the Seventh Embodiment, and deactivated in the other periods. Furthermore, the control signal SG[n] of the present embodiment is activated in the period in which the image signal Vsig[m] is supplied from the scanning-line driver circuit 102 in the case of the Seventh Embodiment, and deactivated in the other periods.

With this configuration, the same operation as that for the pixel circuit PX of the Seventh Embodiment can be performed in the pixel circuit PX of the present embodiment. According to the present embodiment, not only the pixel transistor SST but also the initialization transistor IST can be structured with an oxide-semiconductor transistor having a small leak current compared with that of a silicon transistor. Therefore, discharge of the charge accumulated in the driving transistor DRT through the pixel transistor SST and the initialization transistor IST can be prevented. Hence, similar to the Seventh Embodiments, it is possible to suppress a decrease of the gate potential of the driving transistor even if electrostatic capacitance of the storage capacitor Cs is small or even if the storage capacitor Cs is not provided. Additionally, the gate potential of the driving transistor DRT can be maintained for a long time by the pixel transistor SST and the initialization transistor IST which are oxide-semiconductor transistors. Thus, a writing frequency of the image signal Vsig can be decreased, thereby reducing power consumption of the display device 100.

Note that, it is possible to reduce an area of the pixel circuit when the transistors other than the pixel transistor SST and the initialization transistor IST are prepared with polycrystalline silicon. In addition, when the scanning-line driver circuits 102 and the data-line driver circuit 104 are formed with n-channel type and p-channel type polysilicon transistors, an area of the peripheral circuit can be reduced, by which a frame region can be decreased.

Moreover, according to the present embodiment, the control signal RG[n] corresponding to the pixel circuit PX in the (n+1)th row can be activated at a timing when the control signal RG[n] corresponding to the pixel circuit PX in the nth row is returned to a deactivated state. Thus, as can be understood by comparing FIG. 9B with FIG. 10B, it is also possible to obtain an effect that the horizontal scanning period H can be decreased.

Ninth Embodiment

Figure 11A:
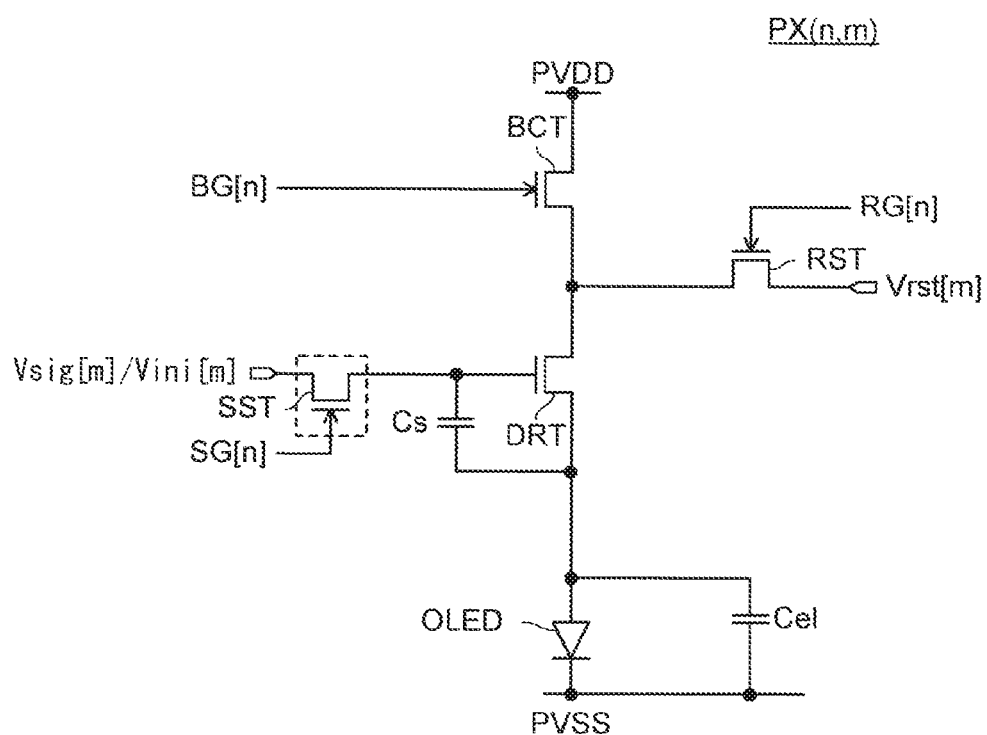
FIG. 11A and FIG. 11B are respectively an equivalent circuit and its timing chart of a pixel of a display device according to an embodiment of the present application.
Figure 11B:
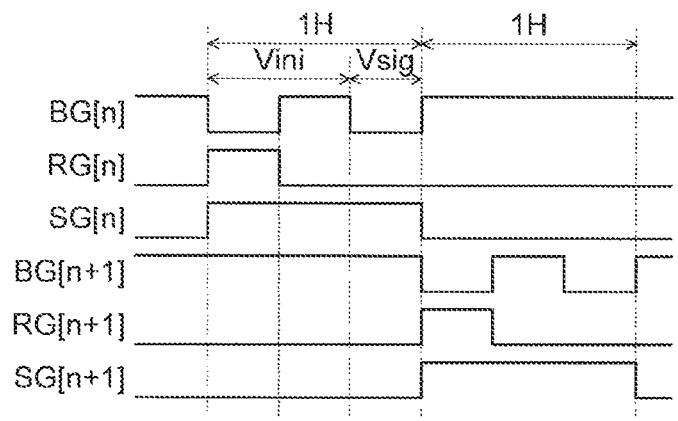

In the present embodiment, a pixel circuit PX having a structure different from those of the First to Eighth Embodiments and a display device having the same are explained by using FIG. 11A and FIG. 11B. FIG. 11A is an equivalent circuit of the pixel circuit PX according to the Ninth Embodiment of the present invention, and FIG. 11B is a timing chart showing change with time of each signal shown in FIG. 11A.

As can be understood by comparing FIG. 11A and FIG. 11B with FIG. 9A and FIG. 9B, respectively, the pixel circuit PX of the present embodiment is different from that of the Seventh Embodiment in that one terminal of the reset transistor RST is not connected to the input terminal of the light-emitting element OLED but is connected to one terminal (the terminal on a side of the output transistor BCT) of the driving transistor DRT.

According to the present embodiment, similar to the Seventh Embodiment, the light-emitting element OLED can emit light at the intensity corresponding to the image signal Vsig[m]. Furthermore, since the pixel transistor SST can be structured with an oxide-semiconductor transistor, it is possible to suppress a decrease of the gate potential of the driving transistor even if electrostatic capacitance of the storage capacitor Cs is small or even if the storage capacitor Cs is not provided. Additionally, the gate potential of the driving transistor DRT can be maintained for a long time by the pixel transistor SST which is an oxide-semiconductor transistor. Thus, a writing frequency of the image signal Vsig can be decreased, thereby reducing power consumption of the display device 100. Note that the reset transistor RST may be disposed in each pixel PX or the scanning-line driver circuit 102 (FIG. 2) in the present embodiment.

Note that, it is possible to reduce an area of the pixel circuit when the transistors other than the pixel transistor SST are prepared with polycrystalline silicon. In addition, when the scanning-line driver circuits 102 and the data-line driver circuit 104 are formed with n-channel type and p-channel type polysilicon transistors, an area of the peripheral circuit can be reduced, by which a frame region can be decreased.

Tenth Embodiment

Figure 12A:
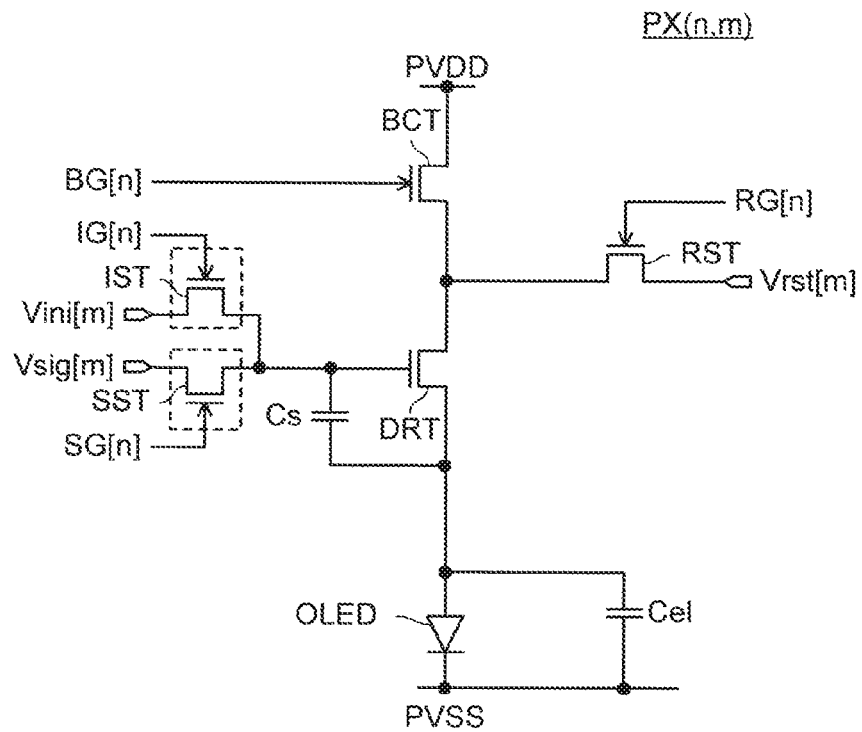
FIG. 12A and FIG. 12B are respectively an equivalent circuit and its timing chart of a pixel of a display device according to an embodiment of the present application.
Figure 12B:
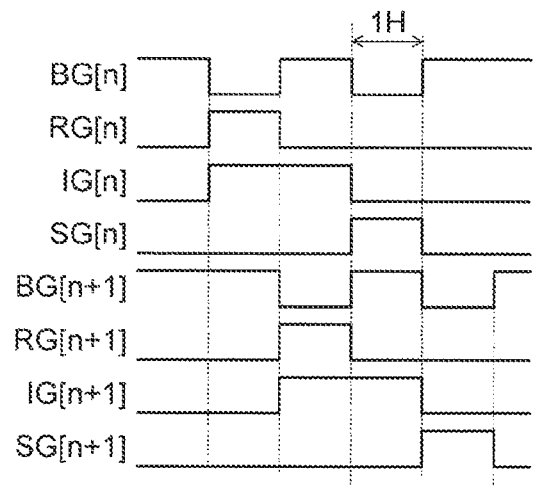

In the present embodiment, a pixel circuit PX having a structure different from those of the First to Ninth Embodiments and a display device having the same are explained by using FIG. 12A and FIG. 12B. FIG. 12A is an equivalent circuit of the pixel circuit PX according to the Tenth Embodiment of the present invention, and FIG. 12B is a timing chart showing change with time of each signal shown in FIG. 12A.

As can be understood by comparing FIG. 12A and FIG. 12B with FIG. 10A and FIG. 10B, respectively, the pixel circuit PX of the present embodiment is different from that of the Eighth Embodiment in that one terminal of the reset transistor RST is not connected to the input terminal of the light-emitting element OLED but is connected to one terminal (the terminal on a side of the output transistor BCT) of the driving transistor DRT.

According to the present embodiment, similar to the Eighth Embodiment, the light-emitting element OLED can emit light at the intensity corresponding to the image signal Vsig[m]. Furthermore, since the pixel transistor SST and the initialization transistor IST can be structured with an oxide-semiconductor transistor, it is possible to suppress a decrease of the gate potential of the driving transistor even if electrostatic capacitance of the storage capacitor Cs is small or even if the storage capacitor Cs is not provided. Additionally, the gate potential of the driving transistor DRT can be maintained for a long time by the pixel transistor SST and the initialization transistor IST which are oxide-semiconductor transistors. Thus, a writing frequency of the image signal Vsig can be decreased, thereby reducing power consumption of the display device 100. Note that the reset transistor RST may also be disposed in each pixel PX or the scanning-line driver circuit 102 (FIG. 2) in the present embodiment.

Note that, it is possible to reduce an area of the pixel circuit when the transistors other than the pixel transistor SST and the initialization transistor IST are prepared with polycrystalline silicon. In addition, when the scanning-line driver circuits 102 and the data-line driver circuit 104 are formed with n-channel type and p-channel type polysilicon transistors, an area of the peripheral circuit can be reduced, by which a frame region can be decreased.

Eleventh Embodiment

1. Layout

Figure 13:
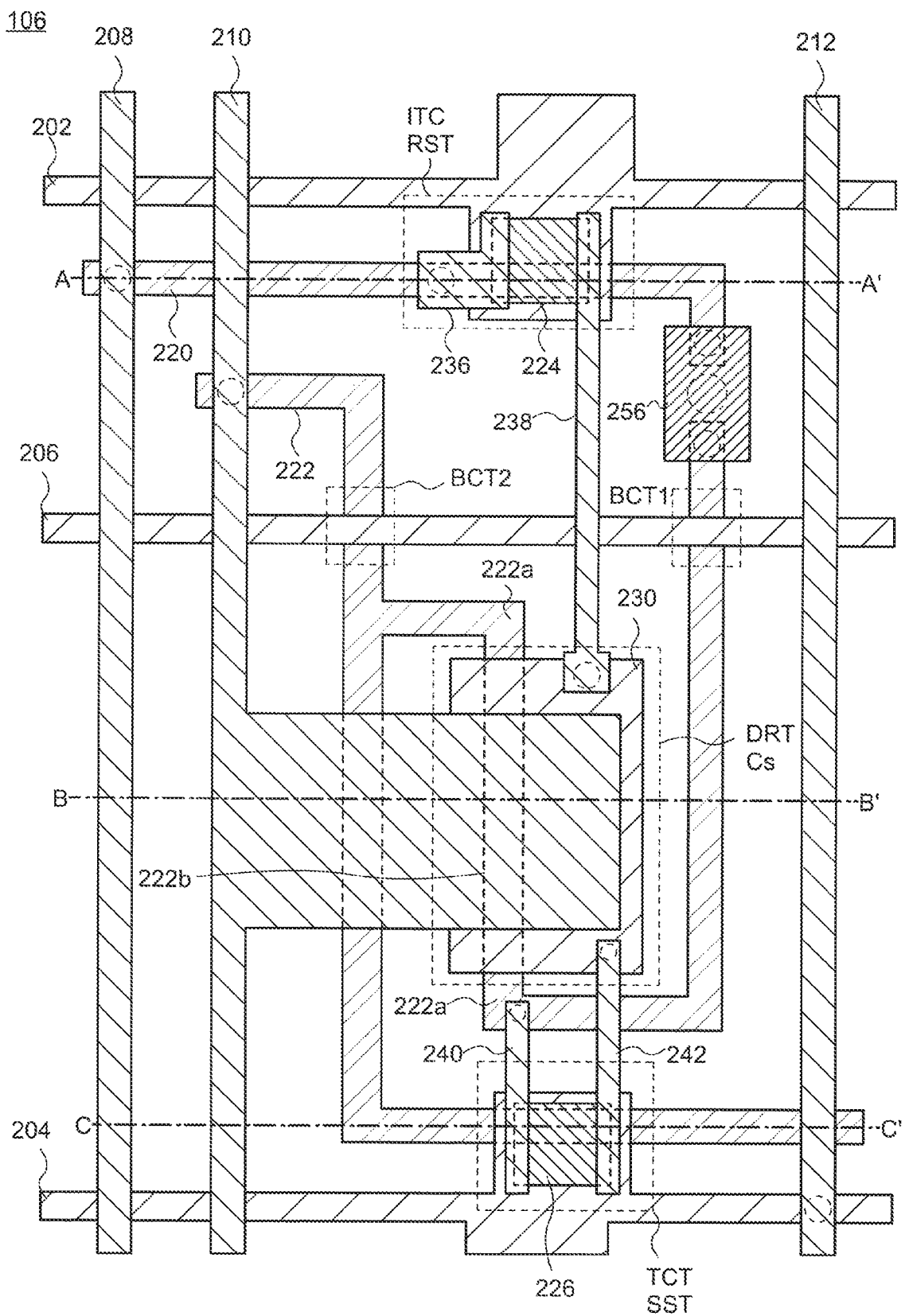
FIG. 13 is a schematic top view of a pixel of a display device according to an embodiment of the present application.
Figure 14A:
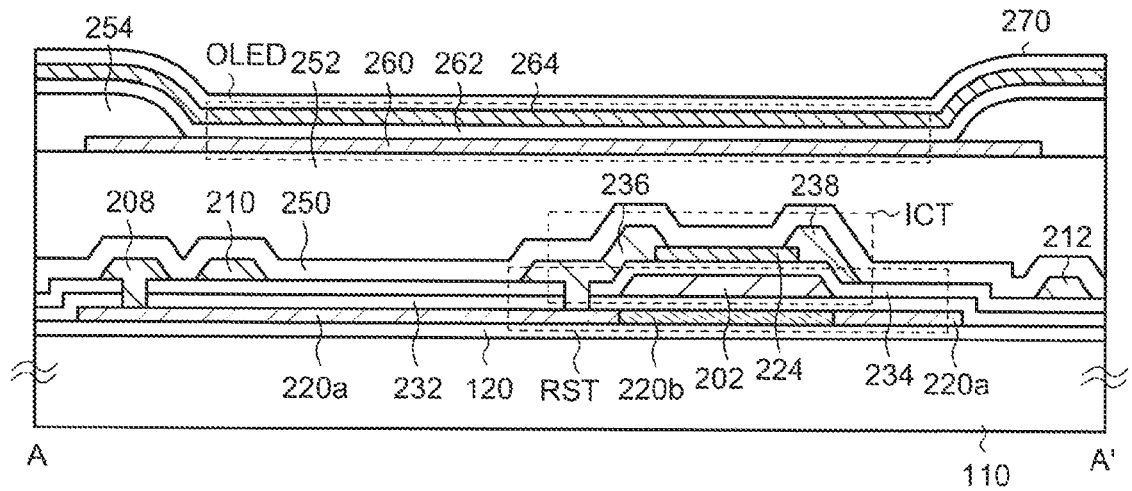
FIG. 14A to FIG. 14C are schematic cross-sectional views of a pixel of a display device according to an embodiment of the present application.
Figure 14B:
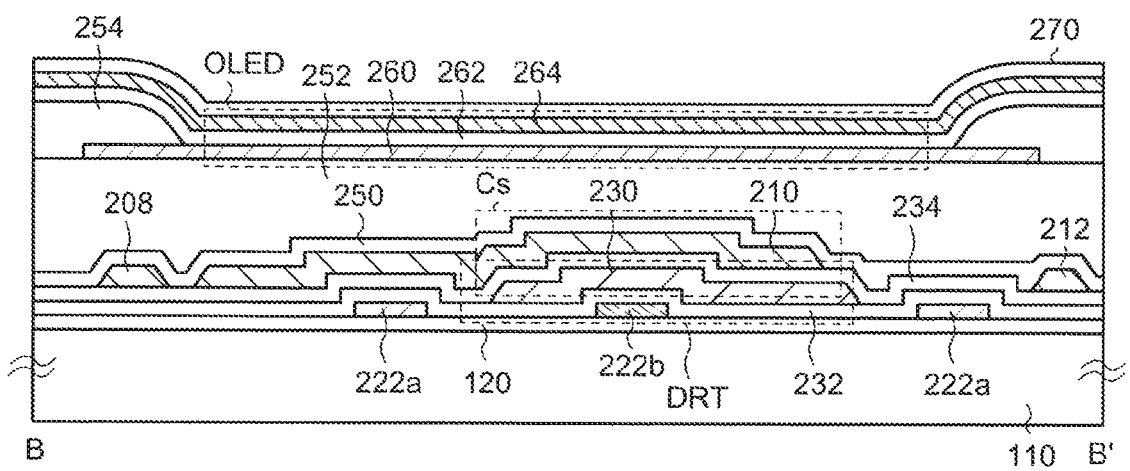

In the present embodiment, a layout of the pixel 106 described in the Second Embodiment is explained by using FIG. 13, FIG. 14A, FIG. 14B, and FIG. 14C. FIG. 13 is a schematic top view of the pixel 106, and FIG. 14A, FIG. 14B, and FIG. 140 are schematic cross-sectional views along chain lines A-A', B-B', and C-C', respectively.

The pixel 106 possesses wirings such as a scanning line 202 of the pixel 106 in the preceding row, a scanning line 204 of the pixel 106, emit signal line 206, a reset signal line 208, a high-potential power-source line 210, and an image signal line 212. The scanning lines 202 and 204 and the emit signal line 206 extend from the data-line driver circuit 104 (FIG. 1 and FIG. 2) to the plurality of pixels 106 located in the corresponding rows and may be configured to respectively supply the scanning signal Scan[n−1], the scanning signal Scan[n], and the emit signal Emit[n]. The scanning lines 202 and 204 and the emit signal line 206 may exist in the same layer.

The reset signal line 208, the high-potential power-source line 210, and the image signal line 212 extend from the data-line driver circuit 104 (FIG. 1 and FIG. 2) to the plurality of pixels 106 located in the corresponding columns and may be configured to respectively supply the reset signal Vrst[m], the power-source potential PVDD, and the image signal Vsig[m]. The reset signal line 208, the high-potential power-source line 210, and the image signal line 212 may exist in the same layer.

As shown in FIG. 13, the pixel 106 has semiconductor films 220, 222, 224, and 226. The semiconductor films 220, 222, 224, and 226 may include silicon or an oxide semiconductor. In the present embodiment, explanation is given for a case where the semiconductor films 220 and 222 are silicon semiconductor films, and the semiconductor films 224 and 226 are oxide semiconductor films. The silicon semiconductor films 220 and 222 may exist in the same layer. Similarly, the oxide semiconductor films 224 and 226 may exist in the same layer.

As shown in FIG. 13, the pixel 106 has the driving transistor DRT, the first switching transistor TCT, the second switching transistor ICT, the pixel transistor SST, the reset transistor RST, the first output transistor BCT1, the second output transistor BCT2, and the storage capacitor Cs.

The driving transistor DRT possesses a part of the silicon semiconductor film 222 provided over the substrate 110 through an undercoat 120, the gate 230, and a first insulating film 232 sandwiched therebetween (see FIG. 14B). As shown in FIG. 14A and FIG. 14B, a region of the silicon semiconductor film 222 overlapping with the gate 230 is an active region 222b of the driving transistor DRT, and a channel is formed in this region. Impurity regions 222a sandwiching the active region 222b and including impurities function as the terminals of the driving transistor DRT. A portion in the first insulating film 232, which is sandwiched by the gate 230 and the active region 222b, functions as a gate insulating film of the driving transistor DRT.

The storage capacitor Cs has the gate 230 of the driving transistor DRT and a part of the high-potential power-source line 210 (a portion protruding rightward in FIG. 13) as the pair of terminals and includes a second insulating film 234 formed therebetween (FIG. 14B). The second insulating film 234 functions as a dielectric film of the storage capacitor Cs. As shown in FIG. 13 and FIG. 14B, the storage capacitor Cs and the driving transistor DRT may be arranged so as to overlap with each other. In this case, the gate 230 of the driving transistor DRT is shared by the storage capacitor Cs and also functions as one terminal of the storage capacitor Cs. Additionally, the active region 222b of the driving transistor DRT overlaps with the gate 230 of the driving transistor DRT and the part of the high-potential power-source line 210 both of which function as the pair of terminals of the storage capacitor Cs.

The reset transistor RST includes a part of the silicon semiconductor film 220, a part of the scanning line 202 of the pixel 106 in the preceding row (a portion protruding downward in FIG. 13), and the first insulating film 232 sandwiched therebetween. As shown in FIG. 14A, a region of the silicon semiconductor film 220 overlapping with the part of the scanning line 202 is an active region 220b of the reset transistor RST, and impurity regions 220a including impurities sandwich the active region 220b. The part of the scanning line 202 serves as the gate of the reset transistor RST, and a region of the first insulating film 232 between this gate and the active region 220b functions as a gate insulating film of the reset transistor RST. The impurity regions 220a sandwiching the active region 220b function as the terminals of the reset transistor RST. One terminal is connected to the reset signal line 208 through an opening portion (a dotted circle in FIG. 13. The same is applied in the following).

The second switching transistor ICT possesses, as a gate, the part of the scanning line 202 (the portion protruding downward in FIG. 13) which is also the gate of the reset transistor RST, and further has the second insulating film 234 functioning as a gate insulating film thereover, the oxide semiconductor film 224 over the second insulating film 234, and the pair of terminals 236 and 238 electrically connected to the oxide semiconductor film 224. A portion of the semiconductor film 224 sandwiched by the terminals 236 and 238 works as an active region of the second switching transistor CT. The terminal 236 is connected to one terminal of the reset transistor RST, and the terminal 238 is connected to the gate 230 of the driving transistor DRT, that is, one terminal of the storage capacitor Cs. As shown in FIG. 13 and FIG. 14A, the reset transistor RST and the second switching transistor ICT may be provided so as to overlap with each other. In this case, the gate of the reset transistor RST is shared by the second switching transistor ICT and also functions as the gate of the second switching transistor ICT. Additionally, the active region 220b of the reset transistor RST overlaps with the active region of the second switching transistor ICT.

Figure 14C:
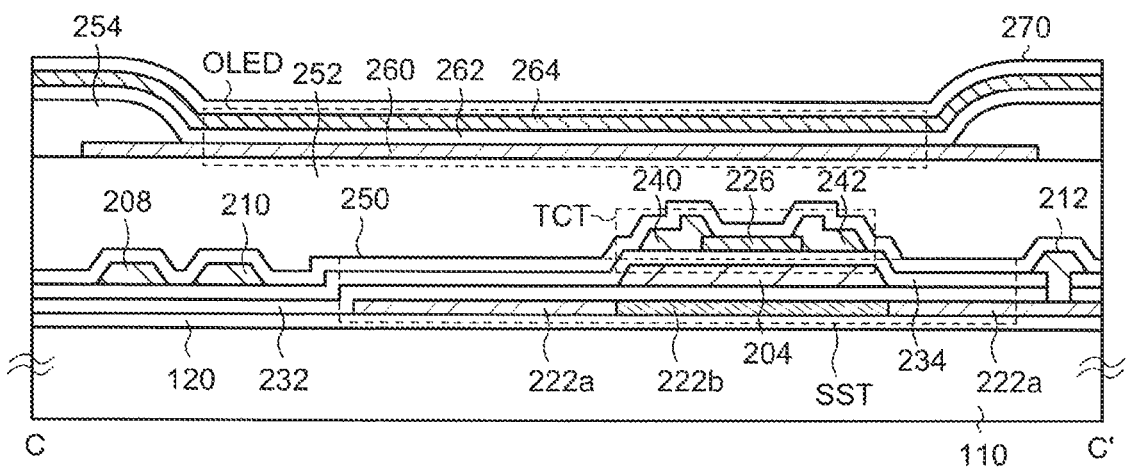

The pixel transistor SST has a part of the silicon semiconductor film 222, the first insulating film 232 formed thereover, and a part of the scanning line 204 (a portion protruding upward in FIG. 13). As shown in FIG. 14C, a region of the silicon semiconductor film 222 overlapping with the part of the scanning line 204 is an active region 222b of the pixel transistor SST, and impurity regions 222a sandwich the active region 222b. The part of the scanning line 204 functions as the gate of the pixel transistor SST, and a region of the first insulating film 232 between this gate and the active region 222b serves as a gate insulating film of the pixel transistor SST. The impurity regions 222a function as the terminals of the pixel transistor SST, and one of the terminals is connected to the image signal line 212.

The first switching transistor TCT has, as a gate, the part of the scanning line 204 (the portion protruding upward in FIG. 13) which also functions as the gate of the pixel transistor SST, the second insulating film 234 functioning as a gate insulating film thereover, the oxide semiconductor film 226 over the second insulating film 234, and the pair of terminals 240 and 242 electrically connected to the oxide semiconductor film 226. A portion of the oxide semiconductor film 226 sandwiched by the terminals 240 and 242 serves as an active region of the first switching transistor TCT. The terminal 240 is connected to one terminal of the driving transistor DRT, and the terminal 242 is connected to the gate 230 of the driving transistor DRT, that is, one terminal of the storage capacitor Cs. As shown in FIG. 13 and FIG. 14C, the pixel transistor SST and the first switching transistor TCT may be provided so as to overlap with each other. In this case, the gate of the pixel transistor SST is shared by the first switching transistor TCT and also functions as the gate of the first switching transistor TCT. Furthermore, the active region 222b of the pixel transistor SST overlaps with the active region of the first switching transistor TCT.

The first output transistor BCT1 has a part of the silicon semiconductor film 222, the first insulating film 232, and the emit signal line 206 (FIG. 13). A region of the silicon semiconductor film 222 overlapping with the emit signal line 206 is an active region of the first output transistor BCT1, and the regions sandwiching the active region function as the terminals. One terminal is connected to the connection electrode 256, and the other terminal is connected to the terminal 240 of the first switching transistor TCT and the terminal of the driving transistor DRT.

Similarly, the second output transistor BCT2 has a part of the silicon semiconductor film 222, the first insulating film 232, and the emit signal line 206 (FIG. 13). A region of the silicon semiconductor film 222 overlapping with the emit signal line 206 is an active region of the second output transistor BCT2, and impurity regions sandwiching the active region function as the terminals. One terminal is connected to the high-potential power-source line 210, and the other terminal is connected to one terminal of the driving transistor DRT and one terminal of the pixel transistor SST.

The pixel 106 may have a third insulating film 250 covering each transistor as an optional structure. A leveling film 252 is disposed over the third insulating film 250, by which depressions, projections, and inclines caused by each transistor and the storage capacitor Cs are absorbed, and a flat surface is provided.

The light-emitting element OLED is arranged over the leveling film 252. The light-emitting element OLED has a first electrode 260 as the input terminal, an EL layer 262, and a second electrode 264. Note that the first electrode 260 is connected, through the connection electrode 265, to one terminal of the reset transistor RST and one terminal of the first output transistor BCT1 in an opening portion formed in the leveling film 252 and the third insulating film 250. A partition wall 254 is formed so as to cover an edge portion of the first electrode 260, and the EL layer 262 is provided so as to cover the first electrode 260 and the partition wall 254.

The pixel 106 may include a passivation film 270 for protecting the light-emitting element OLED as an optional structure.

The pixel 106 of the present embodiment has the pixel structure described in the Second Embodiment. Hence, the decrease of the gate potential of the driving transistor DRT can be suppressed, and reduction of size and power consumption of the display device 100 is feasible even if electrostatic capacitance of the storage capacitor Cs is small or even if the storage capacitor Cs is not provided. Additionally, the size of the pixel 106 can be reduced, and a high-resolution display device can be provided because the pixel 106 has a structure in which the second switching transistor ICT is stacked with the reset transistor RST, the first switching transistor TCT is stacked with the pixel transistor SST, and the driving transistor DRT is stacked with the storage capacitor Cs, 2. Manufacturing Method Hereinafter, a manufacturing method of the aforementioned display device 100 is explained by using FIG. 15A to FIG. 20C. FIG. 15A, FIG. 16A, FIG. 17A, FIG. 18A, FIG. 19A, and FIG. 20A are cross-sectional views along the chain line A-A' of FIG. 13 and correspond to FIG. 14A. FIG. 15B, FIG. 16B, FIG. 17B, FIG. 18B, FIG. 19B, and FIG. 20B are cross-sectional views along the chain line B-B' of FIG. 13 and correspond to FIG. 14B. FIG. 15C, FIG. 16C, FIG. 17C, FIG. 18C, FIG. 19C, and FIG. 20C are cross-sectional views along the chain line C-C' of FIG. 13 and correspond to FIG. 14C.

Figure 15A:
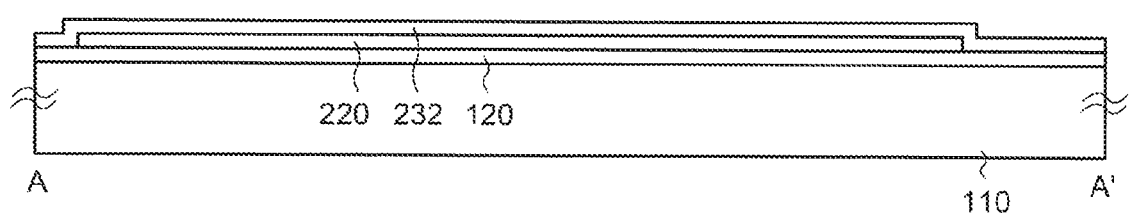
FIG. 15A to FIG. 15C are schematic cross-sectional views showing a manufacturing method of a display device according to an embodiment of the present application.
Figure 15B:
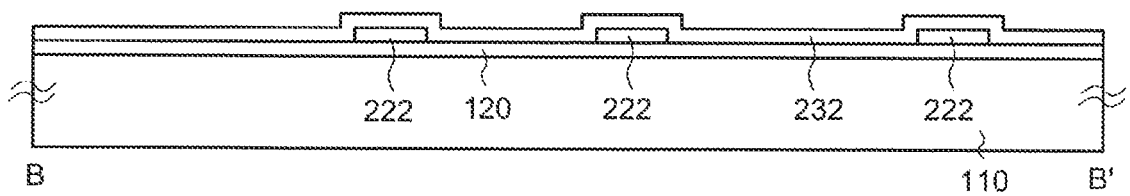
Figure 15C:
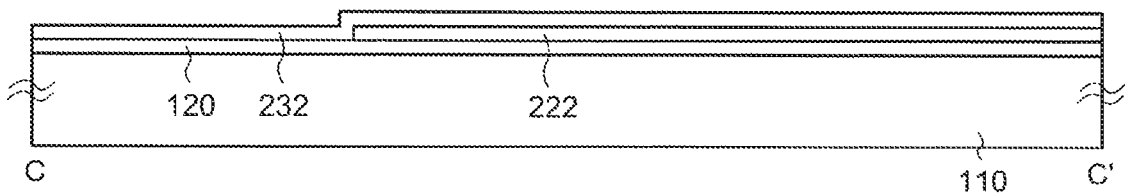

First, the undercoat 120 is formed over the substrate 110 (FIG. 15A, FIG. 15B, and FIG. 15C). The substrate 110 has a function to support the transistors and the like formed thereover. Therefore, a material having heat resistance to a process temperature of the transistors and the like formed thereover and chemical stability to chemicals used in the process may be used. Specifically, the substrate 110 may include glass, quartz, plastics, a metal, ceramics, and the like. When flexibility is provided to the display device 100, a polymer material can be used. For example, a polymer material exemplified by a polyimide, a polyimide, a polyester, and a polycarbonate can be employed. Note that, when a flexible display device 100 is fabricated, the substrate 110 may be called a base material or a base film.

The undercoat 120 is a film having a function to prevent impurities such as an alkaline metal from diffusing to each semiconductor element and the like from the substrate 110 and can include an inorganic insulator such as silicon nitride, on oxide, silicon nitride oxide, and silicon oxynitride. The undercoat 120 can be formed to have a single-layer or stacked-layer structure by applying a chemical vapor deposition method (CVD method), a sputtering method, a lamination method, and the like. When a CVD method is employed, tetraalkoxysilane and the like may be used as a raw material gas. A thickness of the undercoat 120 can be freely selected from a range from 50 nm to 1000 nm and is not necessarily constant over the substrate 110. The undercoat 120 may have different thicknesses depending on position. For instance, when the undercoat 120 is configured with a plurality of layers, a silicon nitride-containing layer may be stacked over the substrate 110, and then a silicon oxide-containing layer may be stacked thereover.

When an impurity concentration in the substrate 110 is low, the undercoat 120 may not be provided or may be formed to cover a part of the substrate 110. For example, when a polyimide having a low concentration of an alkaline metal is employed as the substrate 110, the undercoat 120 may not be provided.

Next, the silicon semiconductor films 220 and 222 are formed over the undercoat 120 (FIG. 15A, FIG. 15B, and FIG. 15C). For example, amorphous silicon (a-Si) with a thickness of approximately 50 nm to 100 nm is formed over the undercoat 120 with a CVD method and is crystallized by performing a heating treatment or irradiation of light such as a laser to transform the a-Si into a polysilicon film. The crystallization may be carried out in the presence of a catalyst such as nickel. After that, the polysilicon film is processed with etching to form the silicon semiconductor films 220 and 222.

Next, the first insulating film 232 is formed over the silicon semiconductor films 220 and 222 (FIG. 15A, FIG. 15B, and FIG. 15C). The first insulating film 232 may have a single-layer structure or a stacked-layer structure and include an inorganic insulator usable in the undercoat 120. Alternatively, the first insulating film 232 may contain an insulator with high permittivity, such as hafnium oxide, zirconium oxide, aluminum oxide, or a mixed oxide thereof. Similar to the undercoat 120, the first insulating film 232 can be formed by applying a sputtering method, a CVD method, or the like. The first insulating film 232 functions as the gate insulating films of the reset transistor RST, the first output transistor BCT1, the second output transistor BCT2, the driving transistor DRT, and the pixel transistor SST.

Figure 16A:
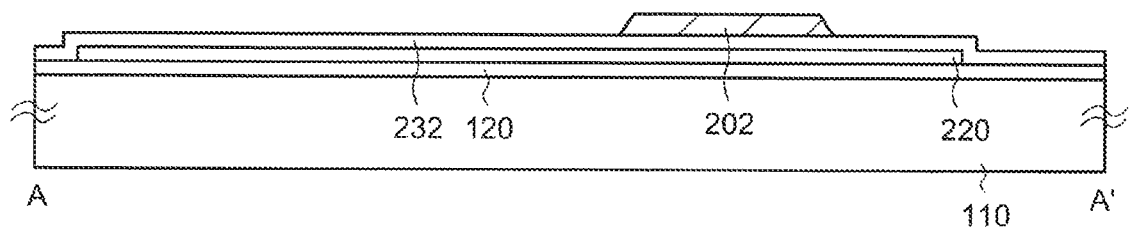
FIG. 16A to FIG. 16C are schematic cross-sectional views showing a manufacturing method of a display device according to an embodiment of the present application.
Figure 16B:
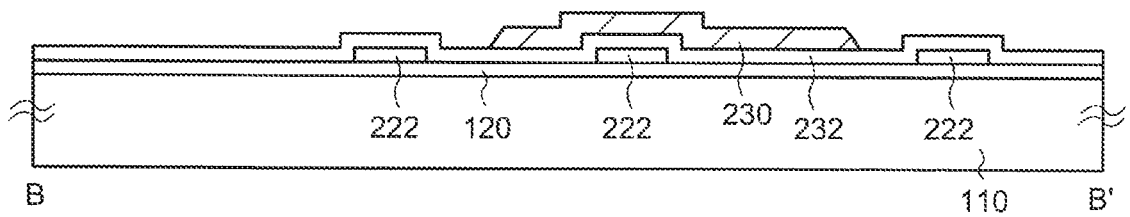
Figure 16C:
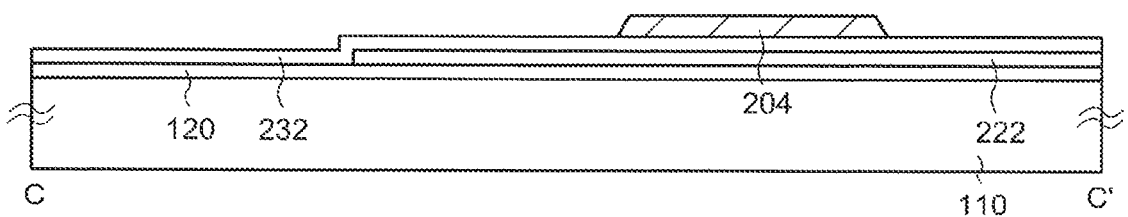

Next, a metal film is formed over the first insulating film 232 and subjected to processing with etching to form the scanning lines 202 and 204, the emit signal line 206, and the gate 230 of the driving transistor DRT (FIG. 16A, FIG. 16B, and FIG. 16C). Thus, these items can exist in the same layer.

The metal film can be formed by using a metal such as titanium, aluminum, copper, molybdenum, tungsten, and tantalum or an alloy thereof so as to have a single-layer or stacked layer structure. When the display device 100 of the present invention possesses a large area, the use of a metal with a high conductivity, such as aluminum and copper, is preferred in order to avoid signal delay. For example, a structure can be employed in which aluminum or copper is sandwiched by a metal having a relatively high melting-point, such as titanium and molybdenum.

Figure 17A:
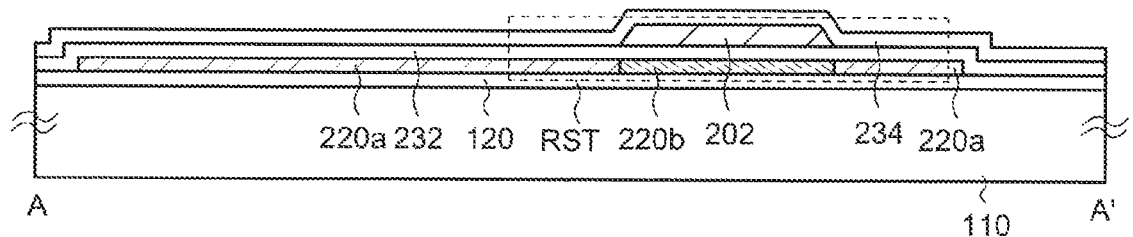
FIG. 17A to FIG. 17C are schematic cross-sectional views showing a manufacturing method of a display device according to an embodiment of the present application.
Figure 17B:
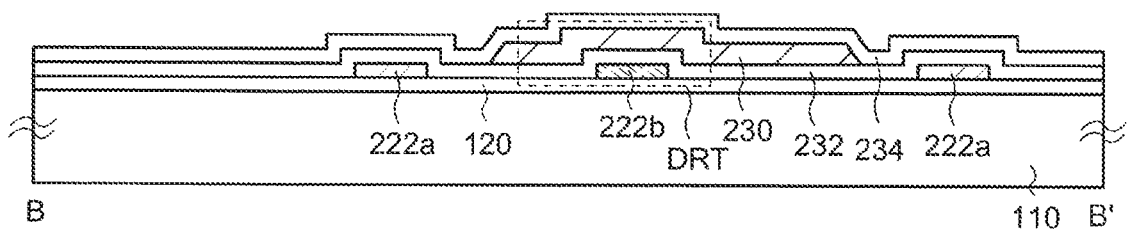
Figure 17C:
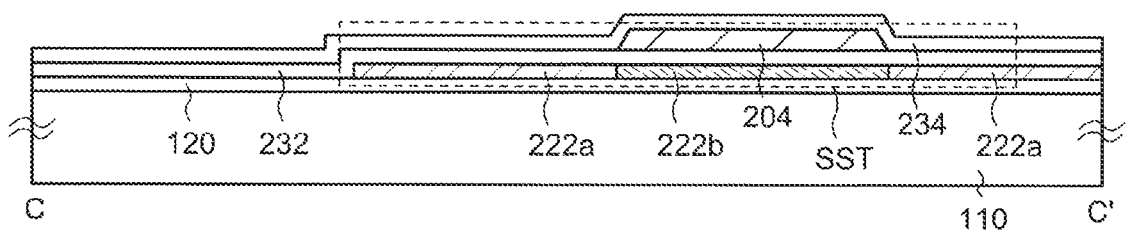

Next, the second insulating film 234 is formed so as to cover the scanning lines 202 and 204, the emit signal line 206, and the gate 230 of the driving transistor DRT (FIG. 17A, FIG. 17B, and FIG. 17C). The second insulating film 234 may have a single-layer structure or a stacked-layer structure. The second insulating film 234 functions as a so-called interlayer film in the reset transistor RST, the first output transistor BCT1, the second output transistor BCT2, the driving transistor DRT, and the pixel transistor SST and simultaneously serves as the gate insulating films of the first output transistor BCT1 and the second output transistor BCT2.

The second insulating film 234 can be formed with the same method as that for the first insulating film 232 and can include the same material as that for the first insulating film 232. It is preferred to use a silicon oxide-containing insulating film in order to suppress carrier generation in the oxide semiconductor films 224 and 226 formed thereover. When the second insulating film 234 has a stacked structure, a region in contact with the oxide semiconductor films 224 and 226 preferably contains silicon oxide.

When the second insulating film 234 is formed, it is preferred that an atmosphere contain a hydrogen-containing gas such as hydrogen gas and water vapor as little as possible, by which the second insulating film 234 with a small hydrogen composition and an oxygen composition close to or larger than stoichiometry can be formed.

Next, an ion-implantation treatment or an ion-doping treatment is selectively performed on the silicon semiconductor films 220 and 222 by using the scanning lines 202 and 204, the emit signal line 206, and the gate 230 of the driving transistor DRT as masks. An element imparting a p-type conductivity, such as boron and aluminum, or an element imparting an n-type conductivity, such as phosphorus and nitrogen, is represented as an ion. This process allows formation of the active regions (e.g., active regions 220b, 222b) and the impurity regions (e.g., impurity regions 220a, 222a) of each transistor (FIG. 17A, FIG. 17B, and FIG. 17C). By the aforementioned processes, the reset transistor RST, the first output transistor BCT1, the second output transistor BCT2, the driving transistor DRT, and the pixel transistor SST are formed.

Figure 18A:
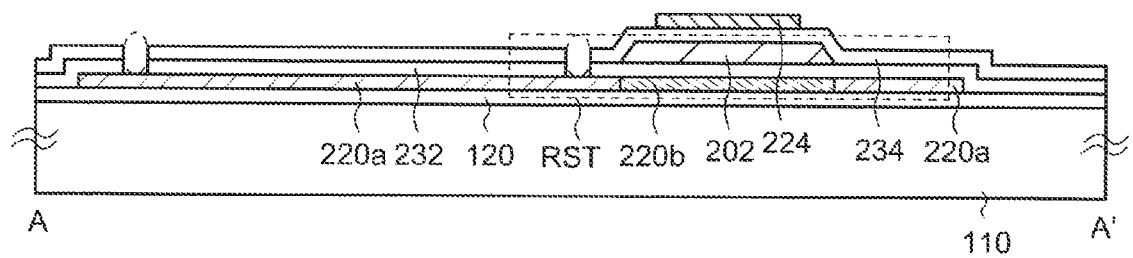
FIG. 18A to FIG. 18C are schematic cross-sectional views showing a manufacturing method of a display device according to an embodiment of the present application.
Figure 18B:
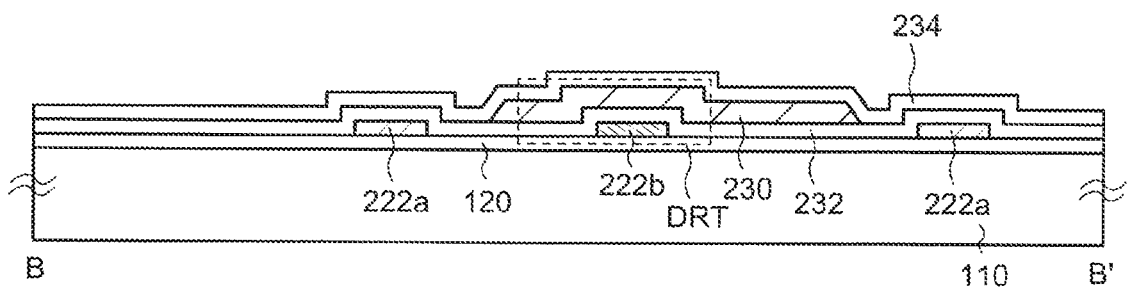
Figure 18C:
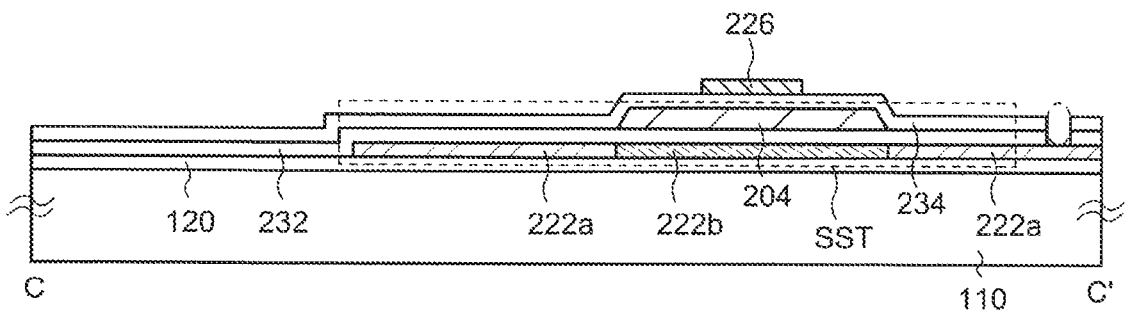
Figure 19A:
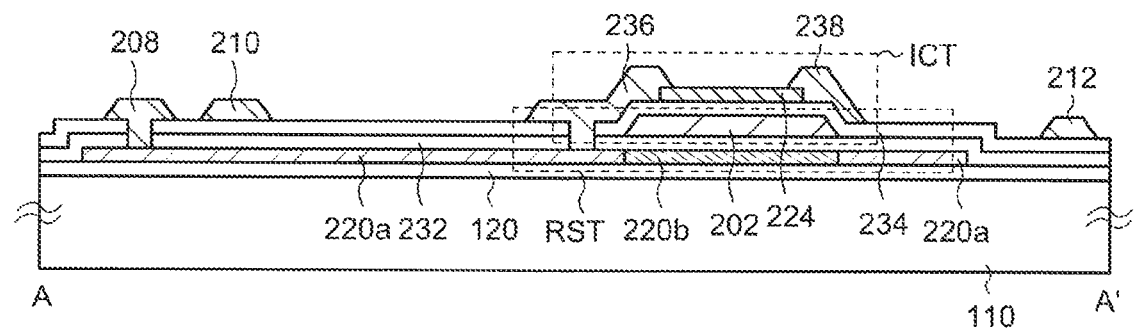
FIG. 19A to FIG. 19C are schematic cross-sectional views showing a manufacturing method of a display device according to an embodiment of the present application.
Figure 19B:
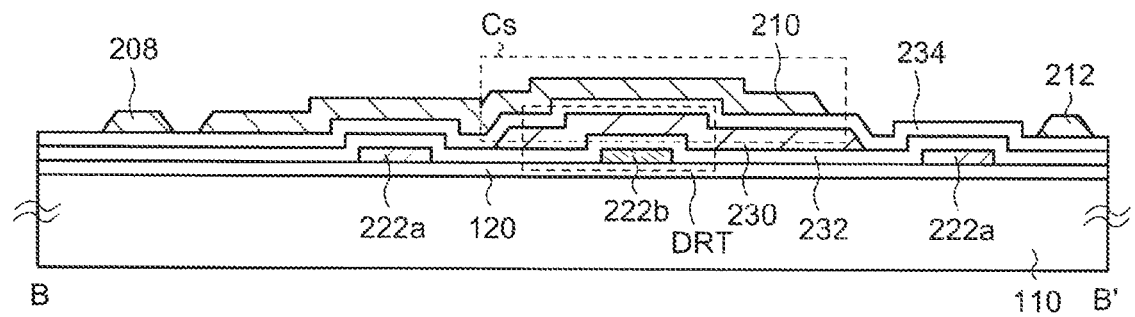
Figure 19C:
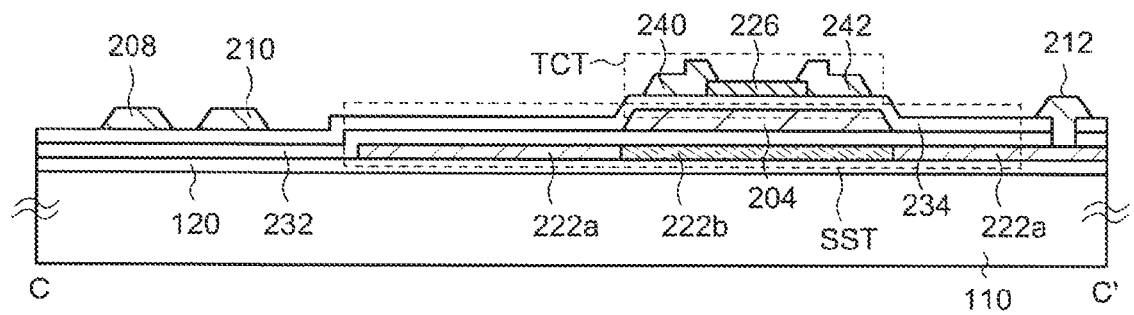

Next, the oxide semiconductor films 224 and 226 are formed over the gate second insulating film 234 so as to overlap with the gates of the reset transistor RST and the pixel transistor SST (FIG. 18A, FIG. 18B, and FIG. 18C). The oxide semiconductor films 224 and 226 may include an oxide semiconductor selected from oxides of Group 13 elements such as indium and gallium. The oxide semiconductor films 224 and 226 may include a plurality of different Group 13 elements and may be indium-gallium-oxide (IGO). The oxide semiconductor films 224 and 226 may further contain Group 12 elements and is exemplified by indium-gallium-zinc-oxide (IGZO). The oxide semiconductor films 224 and 226 may include Group 14 elements such as tin or Group 4 elements such as titanium and zirconium.

The oxide semiconductor films 224 and 226 are formed by utilizing a sputtering method and the like at a thickness of 20 nm to 80 nm or 30 nm to 50 nm. When a sputtering method is applied, the film formation can be conducted under an atmosphere containing oxygen gas, such as a mixed atmosphere of argon and oxygen gas. In this case, a partial pressure of argon may be lower than that of oxygen gas.

The oxide semiconductor films 224 and 226 preferably possess few crystal defects such as an oxygen defect. Hence, it is preferred to perform a heat treatment (annealing) on the oxide semiconductor films 224 and 226. The heat treatment may be conducted before patterning or after patterning the oxide semiconductor films 224 and 226. It is preferred that the heat treatment be performed before patterning because the oxide semiconductor films 224 and 226 may decrease in volume (shrinking) by the heat treatment. The heat treatment may be conducted in the presence of nitrogen, dry air, or atmospheric air at a normal pressure or a reduced pressure. The heating temperature can be selected from a range of 250° C. to 500° C. or 350° C. to 450° C., and the heating time can be selected from a range of 15 minutes to 1 hour. However, the heat treatment can be conducted outside these temperature and time ranges. Oxygen is introduced or migrated to the oxygen defects of the oxide semiconductor films 224 and 226 by the heat treatment, which results in the oxide semiconductor films 224 and 226 having a well-defined structure, a small number of crystal defects, and high crystallinity. Accordingly, the oxide-semiconductor transistors having high reliability and excellent electrical properties such as a low off current and small variation in characteristics (threshold voltage) are obtained.

Next, as shown in FIGS. 18A and 18C, the first insulating film 232 and the second insulating film 234 are processed with etching to form opening portions exposing the impurity regions 220a (dotted ellipses in the drawings). After that, a metal film is formed so as to cover the opening portions and subjected to etching, giving the reset signal line 208, the high-potential power-sauce line 210, the image signal line 212, the terminals 236, 238, 240, and 242, and the like (FIG. 13, FIG. 19A, FIG. 19B, and FIG. 19C). Therefore, these terminals and wirings exist in the same layer. These terminals and wirings can be formed by applying a similar material, structure, and method to those for the formation of the metal film used in the formation of the scanning lines 202 and 204, the emit signal line 206, and the gate 230 of the driving transistor DRT.

With the above processes, the first switching transistor TCT, the second switching transistor ICT, and the storage capacitor Cs are fabricated.

Figure 20A:
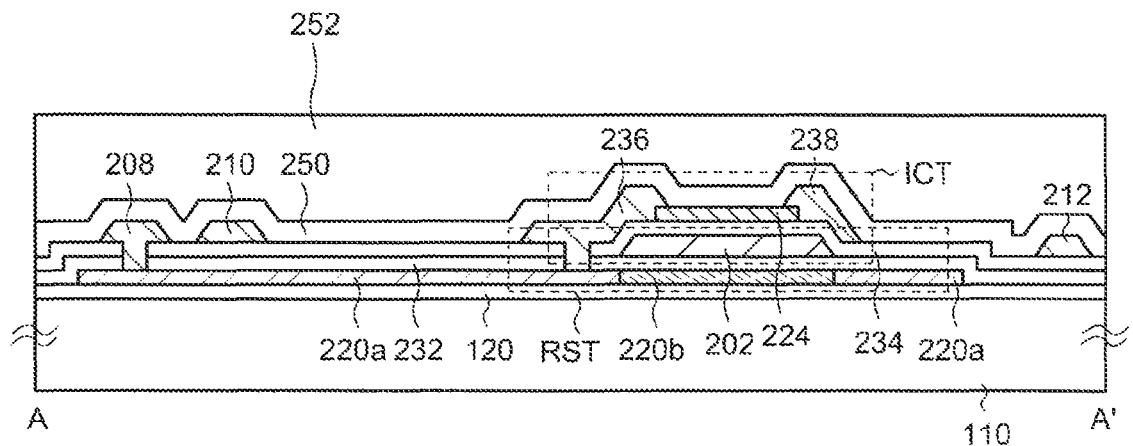
FIG. 20A to FIG. 20C are schematic cross-sectional views showing a manufacturing method of a display device according to an embodiment of the present application.
Figure 20B:
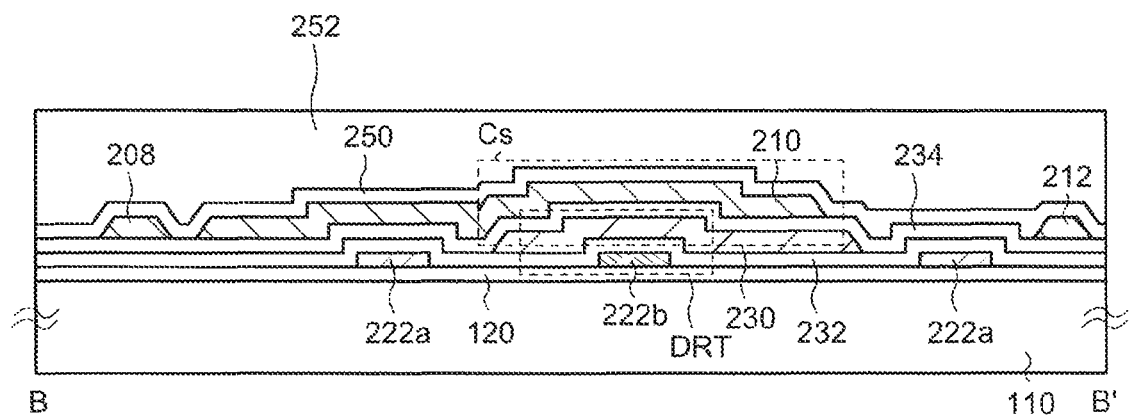
Figure 20C:
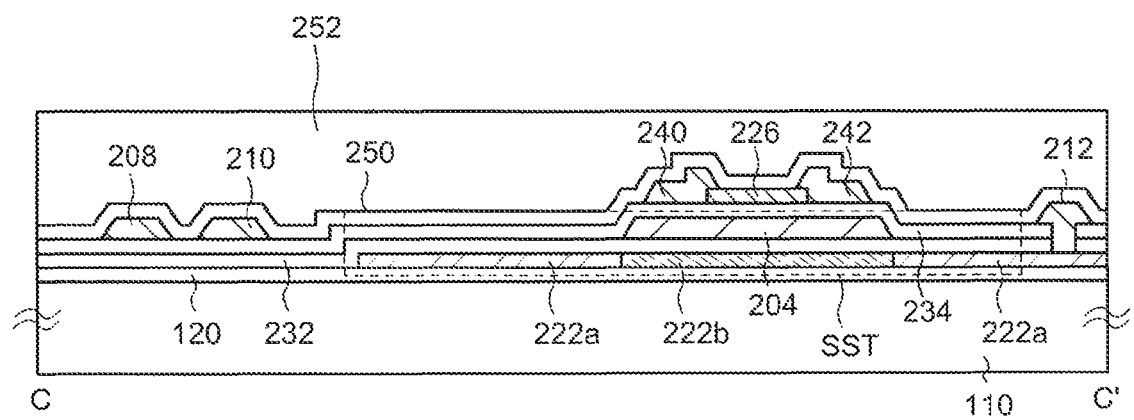

Next, the third insulating film 250 is formed so as to cover the formed transistors and the storage capacitor Cs (FIG. 20A, FIG. 20B, and FIG. 20C). The third insulating film 250 may have a structure similar to those of the first insulating film 232 and the second insulating film 234 and may be prepared with a method similar to those of the first insulating film 232 and the second insulating film 234. After that, the leveling film 252 is formed over the third insulating film 250 (FIG. 20A, FIG. 20B, and FIG. 20C). The leveling film 252 can be formed by using an organic insulator. A polymer material such as an epoxy resin, an acrylic resin, a polyimide, a polyimide, a polyester, a polycarbonate, and a polysiloxane is represented as an organic insulator, and the leveling film 252 can be formed with a wet-type film-forming method such as a spin-coating method, an ink-jet method, a printing method, and a dip-coating method. The leveling film 252 may have a stacked structure including a layer containing the aforementioned organic insulator and a layer containing an inorganic insulator. In this case, a silicon-containing inorganic insulator such as silicon oxide, silicon nitride, silicon nitride oxide, and silicon oxynitride is represented as an inorganic insulator, and the layer containing an inorganic insulator can be formed with a sputtering method or a CVD method. Note that, in the case where the third insulating film 250 is not formed, the leveling film 252 is in contact with the oxide semiconductor films 224 and 226, the reset signal line 208, the high-potential power-source line 210, the image signal line 212, the terminals 236, 238, 240, and 242, and the like.

Next, the leveling film 252 is processed to form the opening portions, and the connection electrode 256 is formed to cover the opening portions (FIG. 13). The contact electrode 256 may be prepared with a light-transmitting material exemplified by a conductive oxide such as indium-tin oxide (ITO) and indium-zinc oxide (IZO). Alternatively, the connection electrode 256 may be formed with a metal such as aluminum, copper, molybdenum, and tungsten or an alloy thereof. After that, the first electrode 260 of the light-emitting element OLED is formed so as to cover the opening portions (FIG. 21A, FIG. 21B, and FIG. 21C), by which the first electrode 260 and one terminal of the first output transistor BCT1 are electrically connected to each other.

When light emission from the light-emitting element OLED is extracted through the substrate 110, a material having a light-transmitting property, such as ITO and IZO, can be used for the first electrode 260. On the other hand, when the light emission from the light-emitting element OLED is extracted from a side opposite to the substrate 110, a metal such as aluminum and silver or an alloy thereof can be used. Alternatively, stacked layers of the aforementioned metal or alloy and the conductive oxide can be employed. For example, a stacked structure in which a metal is sandwiched by a conductive oxide (e.g., ITO/silver/ITO etc.) can be used.

Figure 21A:
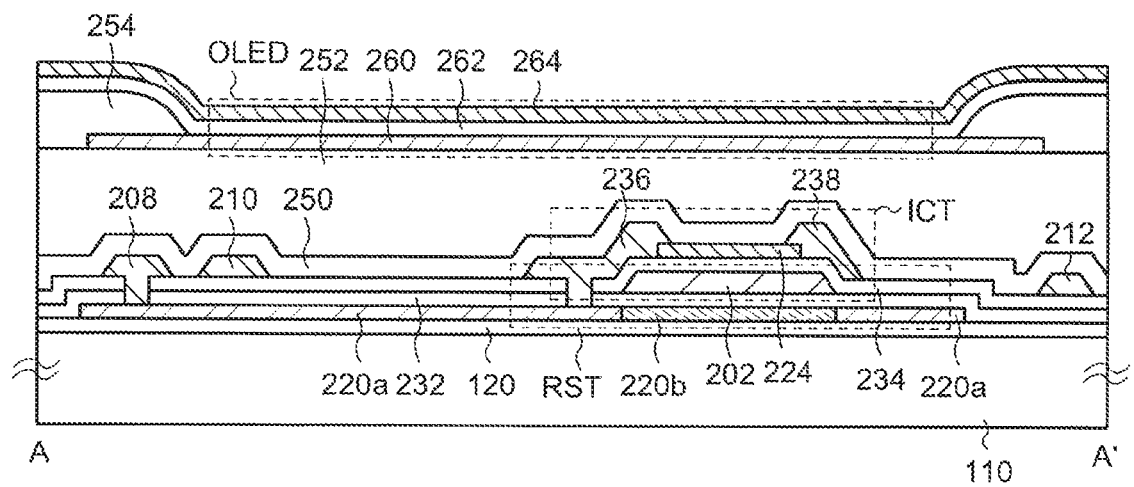
FIG. 21A to FIG. 21C are schematic cross-sectional views showing a manufacturing method of a display device according to an embodiment of the present application.
Figure 21B:
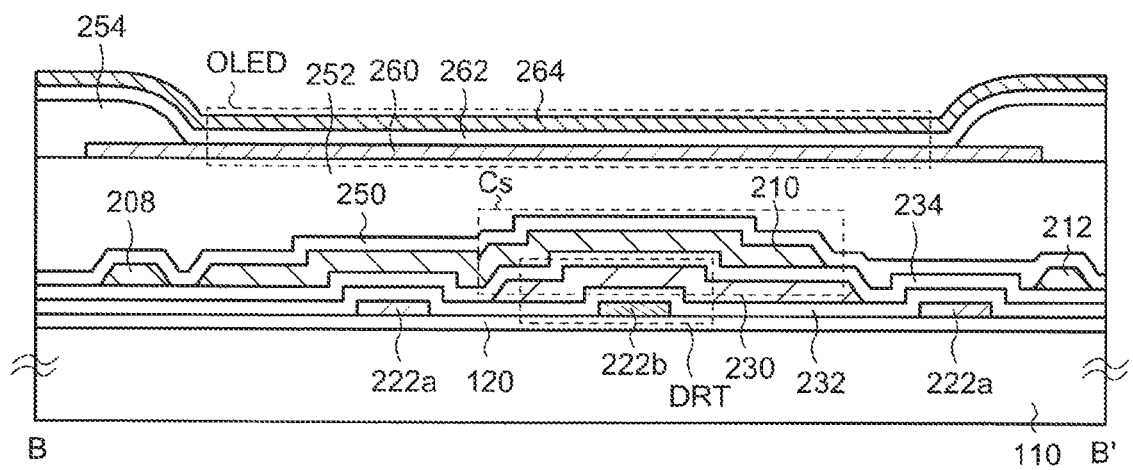
Figure 21C:
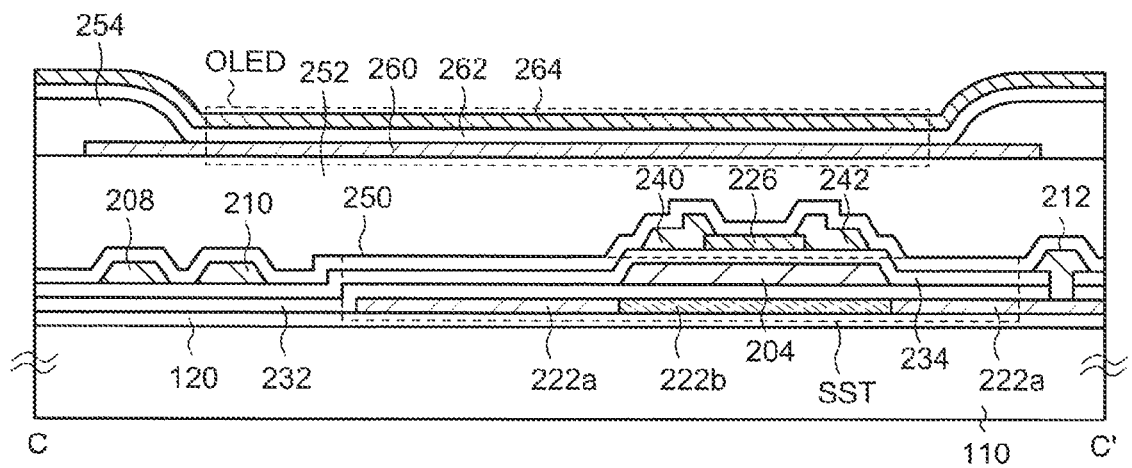

Next, the partition wall 254 is formed (FIG. 21A, FIG. 21B, and FIG. 21C). The partition wall 254 can be formed by using a material usable in the leveling film 252 with a wet-type film-forming method. The partition wall 254 has an opening portion exposing a part of the first electrode 260, and an edge portion of the opening portion preferably has a moderately tapered shape, thereby preventing generation of a defect in the EL layer 262 and the second electrode 264 formed later. The partition wall 254 has a function to absorb depression is and projections caused by the first electrode 260 and the opening portions formed in the leveling film 252 as well as a function to electrically insulate the first electrodes 260 of the adjacent pixels 106 from each other. The partition wall 254 is also called a bank or a rib.

Next, the EL layer 262 is formed over the first electrode 260 (FIG. 21A, FIG. 21B, and FIG. 21C). The EL layer 262 is formed so as cover the first electrode 260 and the partition wall 254. The EL layer 262 may be structured by a single layer or a plurality of layers. For example, the EL layer 262 can be structured by appropriately combining a carrier-injection layer, a carrier-transporting layer, an emission layer, a carrier-blocking layer, an exciton-blocking layer, and the like. The EL layer 262 may be different in structure between adjacent pixels 106. For example, the EL layer 262 may be formed so that the emission layer is different but other layers are the same in structure between the adjacent pixels 106. With this structure, different emission colors can be obtained from the adjacent pixels 106, and full color display can be realized. On the contrary, the same EL layer 262 may be used in all pixels 106. In this case, the EL layer 262 giving white emission may be formed so as to be shared by all pixels 106, and the wavelength of the light extracted from each pixel 106 may be selected by using a color filter and the like. The EL layer 262 can be formed by applying an evaporation method or the wet-type film-formation method.

Next, the second electrode 264 is formed over the EL layer 262 (FIG. 21A, FIG. 21B, and FIG. 21C). When light emission from the light-emitting element OLED is extracted through the substrate 110, a metal such as aluminum and silver or an alloy thereof can be used for the second electrode 264. On the other hand, when light-emission from the light-emitting element OLED is extracted through the second electrode 264, the second electrode 264 is formed by using the aforementioned metal or alloy so as to have a thickness which allows visible light to pass therethrough. Alternatively, a material having a light-transmitting property, such as a conductive oxide exemplified by ITO, IZO, and the like, can be used for the second electrode 264. Furthermore, a stacked structure of the aforementioned metal or alloy with a conductive oxide (e.g., Mg-Ag/ITO, etc.) can be employed in the second electrode 264. The second electrode 264 can be formed with an evaporation method, a sputtering method, and the like. With the above processes, the light-emitting element OLED is fabricated.

The passivation film 270 may be disposed over the second electrode 264 as an optional structure (FIG. 14A, FIG. 14B, and FIG. 14C). One of the functions of the passivation film 270 is to prevent water from entering the precedently prepared light-emitting element OLED from outside. The passivation film 270 is preferred to have a high gas-barrier property. For example, it is preferred that the passivation film 270 be formed by using an inorganic material such as silicon nitride, silicon oxide, silicon nitride oxide, and silicon oxynitride. Alternatively, an organic resin including an acrylic resin, a polysiloxane, a polyimide, a polyester, and the like may be used. The passivation film 270 may have a single-layer structure or a stacked-layer structure. For example, the passivation film 270 may have a structure in which a layer including an organic resin is sandwiched by two layers including an inorganic material.

The opposing substrate 112 (see FIG. 1) may be arranged over the passivation film 270 as an optional structure. The opposing substrate 112 is fixed to the substrate 110 with an adhesive (not shown). In this case, a space between the opposing substrate 112 and the passivation film 270 may be filled with an inert gas or a filler such as a resin. Alternatively, the passivation film 270 and the opposing substrate 112 may be directly adhered with an adhesive. When the opposing substrate 112 is fixed to the substrate 110, a gap therebetween may be adjusted by adding a spacer in the adhesive or the filler. Alternatively, a structure functioning as a spacer may be formed between the pixels 106.

Furthermore, a light-shielding film having an opening in a region overlapping with the emission region and a color filter overlapping with the emission region may be disposed over the opposing substrate 112. The light-shielding film is formed by using a metal with a relatively low reflectance, such as chromium and molybdenum, or a mixture of a resin material with a coloring material having a black or similar color. The light-shielding film has a function to shield scattered or reflected external light and the like other than the light directly obtained from the emission region. The color filter can be formed while changing its optical properties between adjacent pixels 106 so that red emission, green emission, and blue emission are extracted. The light-shielding film and the color filter may be provided over the opposing substrate 112 with an undercoat film interposed therebetween, and an overcoat layer may be further arranged to cover the light-shielding film and the color filter. With the above processes, the display device 100 of the present embodiment is manufactured.

Twelfth Embodiment

Figure 22:
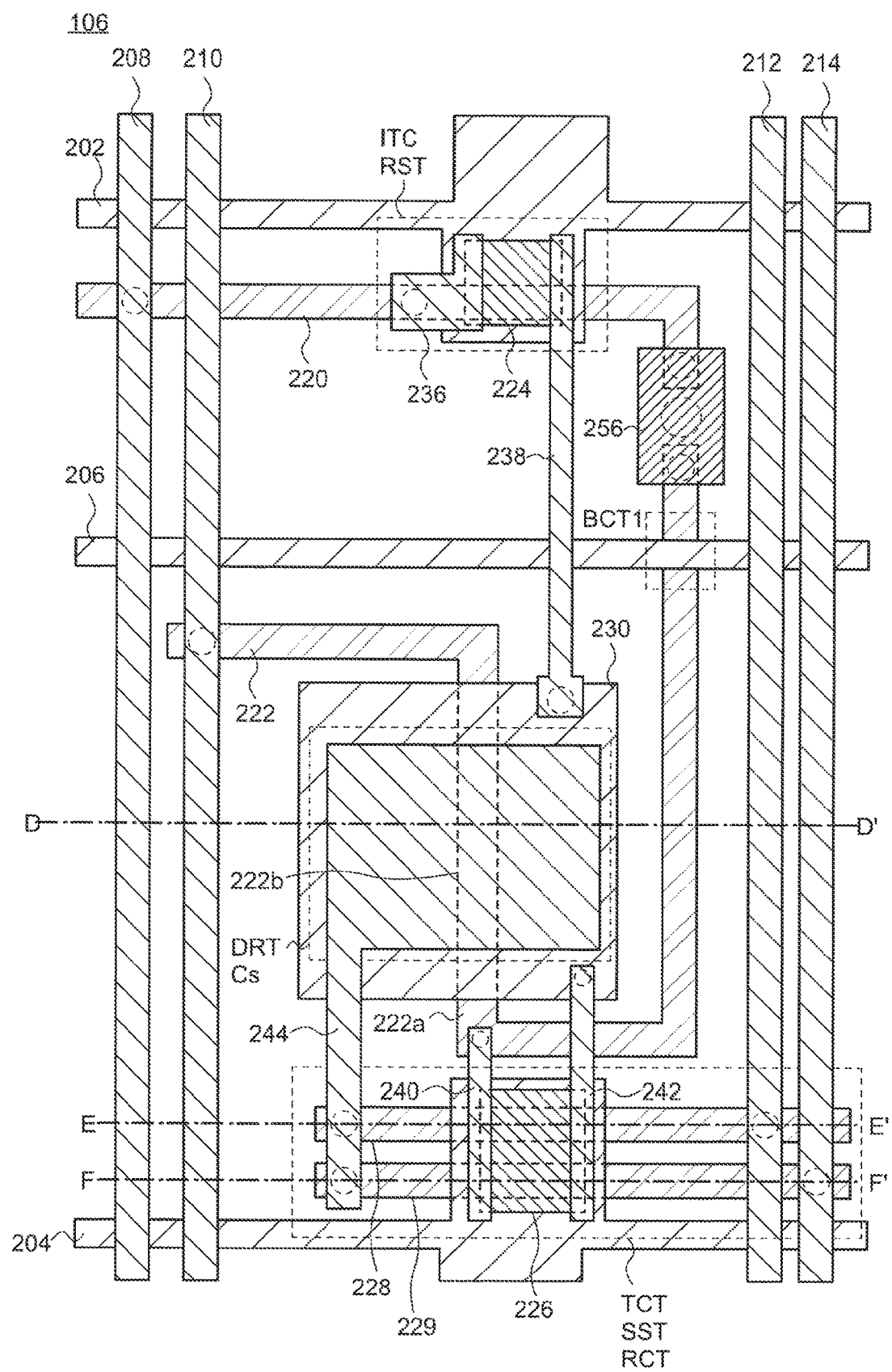
FIG. 22 is a schematic top view of a pixel of a display device according to an embodiment of the present application.
Figure 23A:
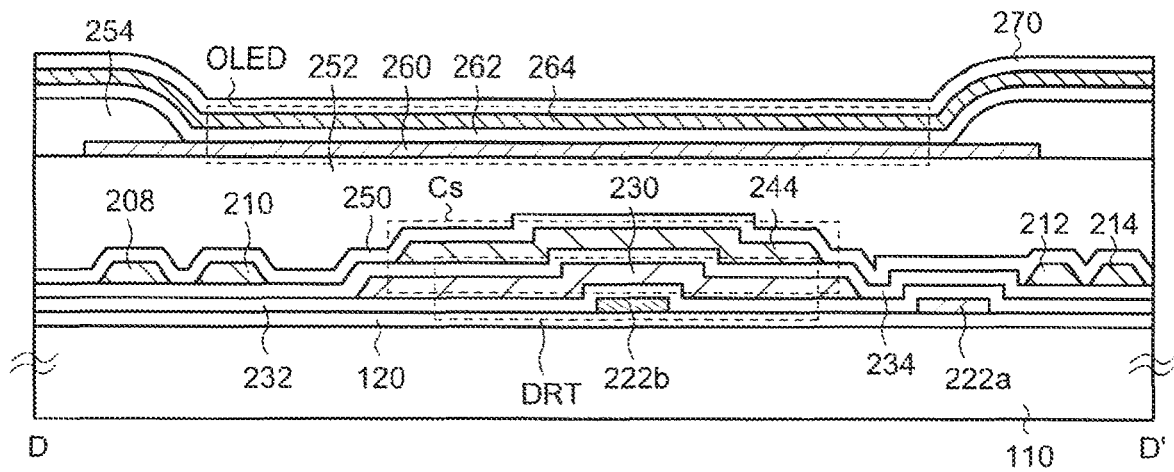
FIG. 23A to FIG. 23C are schematic cross-sectional views of a pixel of a display device according to an embodiment of the present application.
Figure 23B:
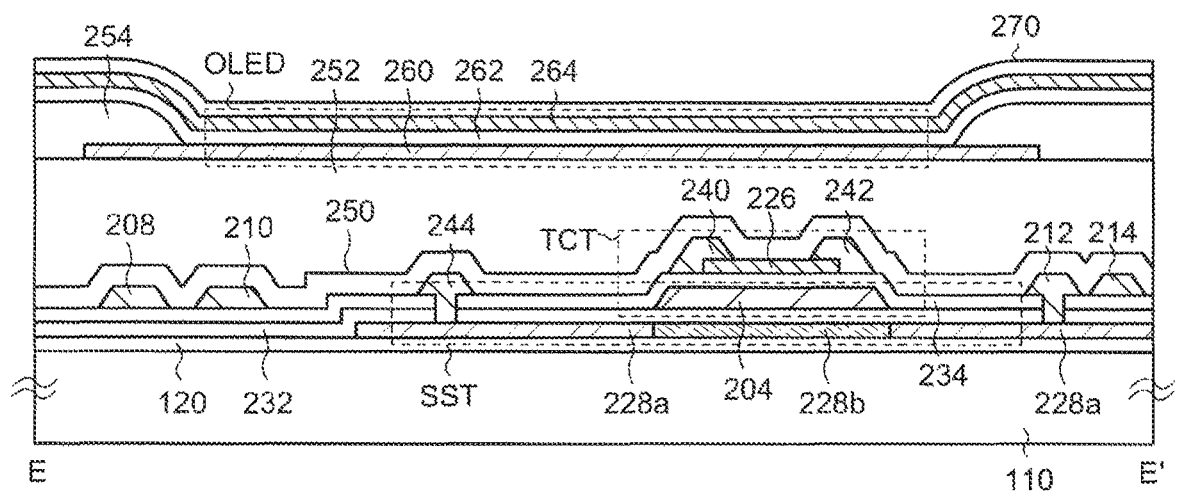
Figure 23C:
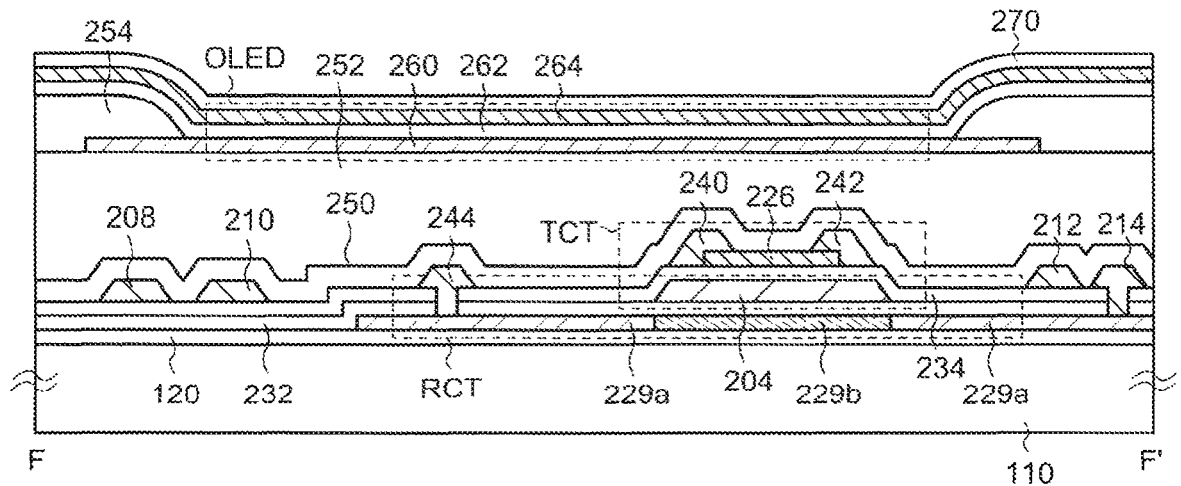

In the present embodiment, a layout of the pixel 106 described in the Fourth Embodiment is explained by using FIG. 22, FIG. 23A, FIG. 23B, and FIG. 23O. FIG. 22 is a schematic top view of the pixel 106, and FIG. 23A, FIG. 23B, and FIG. 23C are cross-sectional views along chain lines D-D', E-E', and F-F' of FIG. 22, respectively. Explanation of the structures the same as those of the First to Eleventh Embodiments may be omitted.

The pixel 106 of the display device 100 according to the present embodiment is mainly different from that of the pixel 106 according to the Eleventh Embodiment in that not only the pixel transistor SST but also the reference transistor RCT overlap with the first switching transistor TCT and that a reference signal line 214 connected to the reference transistor RCT is provided.

Specifically, as shown in FIG. 22, the pixel 106 has the reference signal line 214 extending from the data-line driver circuit 104 (FIG. 1, FIG. 2). The reference signal line 214 is configured to supply the reference signal Vref[m]. The pixel 106 further possesses silicon semiconductor films 228 and 229 which can exist in the same layer as the silicon semiconductor films 220 and 222 and which structure the pixel transistor SST and the reference transistor RCT.

Similar to the Eleventh Embodiment, the reset transistor RST and the second switching transistor ICT overlap with each other, and the driving transistor DRT and the storage capacitor Cs also overlap with each other as shown in FIG. 22 and FIG. 23A. Furthermore, as shown in FIG. 23B, the pixel transistor SST and the first switching transistor TCT overlap with each other. The silicon semiconductor film 228 of the pixel transistor SST has an active region 228b and impurity regions 228a sandwiching the active region 228b, and one of the impurity regions 228a is connected to the terminal 244, and the other is connected to the image signal line 212.

As shown in FIG. 23C, the reference transistor RCT includes the silicon semiconductor film 229 formed over the substrate 110 through the undercoat 120, a part of the scanning line 204 (a portion protruding upward in FIG. 22), and the first insulating film 232 sandwiched therebetween. A region of the silicon semiconductor film 229 overlapping with the part of the scanning line 204 is an active region 229b of the reset transistor RST, and impurity regions 229a sandwich the active region 229b. The part of the scanning line 204 functions as the gate of the reset transistor RST, and a region of the first insulating film 232 between this gate and the active region 229b functions as the gate insulating film of the reset transistor RST. One of the impurity regions 229a is connected to the terminal 244, and the other is connected to the reference signal line 214.

The first switching transistor TCT has the part of the scanning line 204 (the portion protruding upward in FIG. 22) as the gate, the second insulating film 234 functioning as the gate insulating film thereover, the oxide semiconductor film 226 over the second insulating film 234, and the pair of terminals 240 and 242 electrically connected to the oxide semiconductor film 226. The portion of the oxide semiconductor film 226 sandwiched by the terminals 240 and 242 serves as the active region of the first switching transistor TCT. The terminal 240 is connected to one terminal of the driving transistor DRT, and the terminal 242 is connected to the gate 230 of the driving transistor DRT, that is, one terminal of the storage capacitor Cs (FIG. 22). As shown in FIG. 22 and FIG. 230, the reference transistor RCT and the first switching transistor TCT can be arranged so as to overlap with each other. In this case, the gate of the reference transistor RCT is also shared by the first switching transistor TCT and functions as the gate of the first switching transistor TCT. Moreover, the active region 229b of the reference transistor RCT overlaps with the active region of the first switching transistor TCT.

The pixel 106 of the present embodiment has the pixel structure described in the Fourth Embodiment. Hence, the decrease of the gate potential of the driving transistor DRT can be suppressed, and reduction of size and power consumption of the display device 100 is feasible even if electrostatic capacitance of the storage capacitor Cs is small or even if the storage capacitor Cs is not provided. Additionally, the size of the pixel 106 can be reduced and a high-resolution display device can be provided because the pixel 106 has a structure in which the second switching transistor ICT is stacked with the reset transistor RST, the pixel transistor SST and the reference transistor RCT are stacked with the first switching transistor TCT, and the driving transistor DRT is stacked with the storage capacitor Cs.

Thirteenth Embodiment

Figure 24:
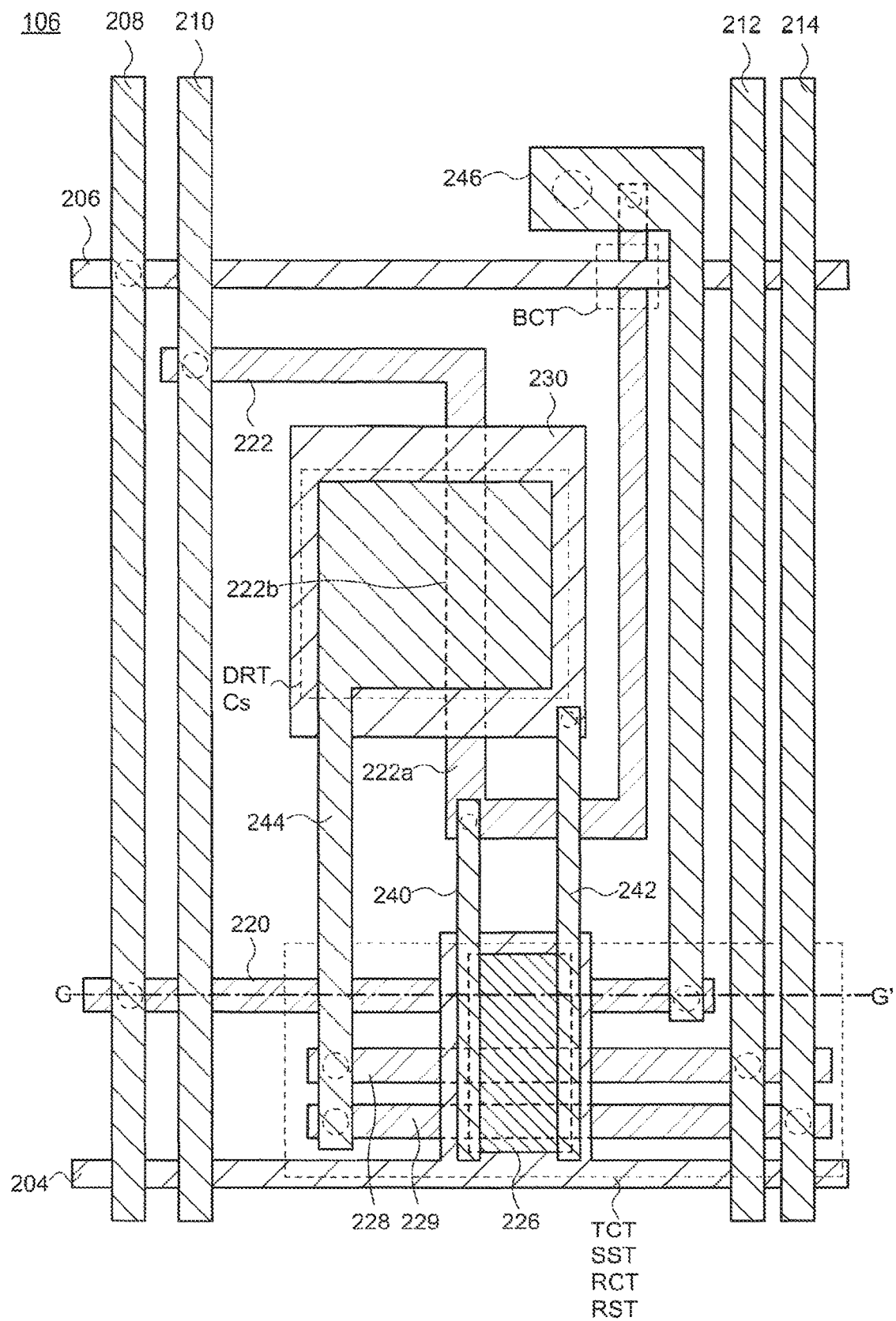
FIG. 24 is a schematic top view of a pixel of a display device according to an embodiment of the present application.
Figure 25:
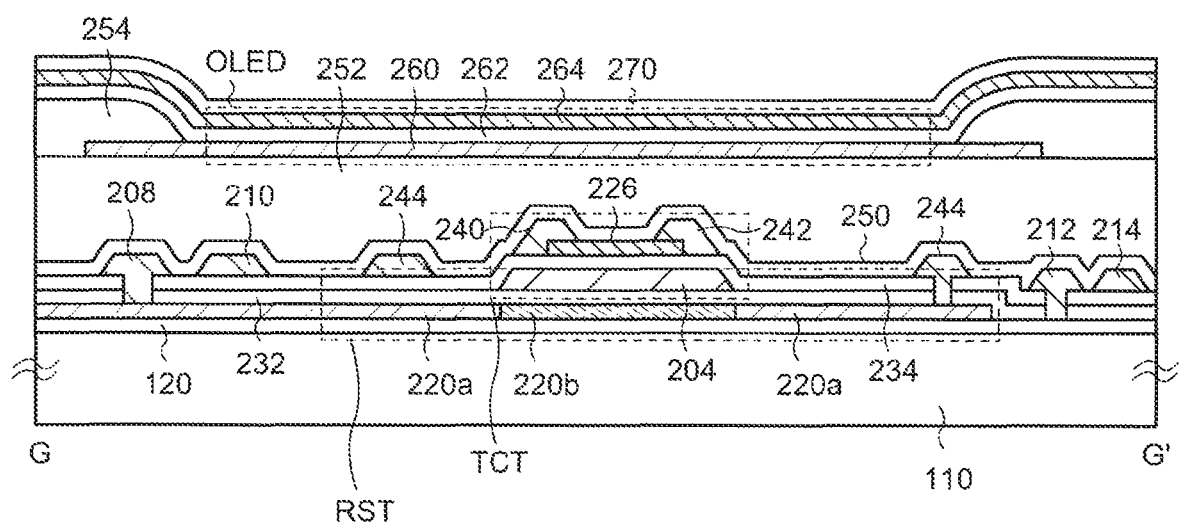
FIG. 25 is a schematic cross-sectional view of a pixel of a display device according to an embodiment of the present application.

In the present embodiment, a layout of the pixel 106 described in the Sixth Embodiment is explained by using FIG. 24 and FIG. 25. FIG. 24 is a schematic top view of the pixel 106, and FIG. 25 is a cross-sectional view along a chain line G-G' of FIG. 24. Explanation of the structures the same as those of the First to Twelfth Embodiments may be omitted.

The pixel 106 of the display device 100 according to the present embodiment is mainly different from that of the pixel 106 according to the Twelfth Embodiment in that not only the pixel transistor SST and the reference transistor RCT but also the reset transistor RST overlap with the first switching transistor TCT.

Specifically, similar to the Twelfth Embodiment, the driving transistor DRT and the storage capacitor Cs overlap with each other, and the reference transistor RCT and the first switching transistor TCT also overlap with each other. Apart from the Twelfth Embodiment, the reset transistor RST having the semiconductor film 220 overlaps with the first switching transistor TCT. That is, the reset transistor RST has the silicon semiconductor film 220 formed over the substrate 110 through the undercoat 120, a part of the scanning line 204 (a portion protruding upward in FIG. 24), and the first insulating film 232 sandwiched therebetween. A region of the silicon semiconductor film 220 overlapping with the part of the scanning line 204 is the active region 220b of the reset transistor RST, and the impurity regions 220a sandwich the active region 220b. The part of the scanning line 204 functions as the gate of the reset transistor RST, and a region of the first insulating film 232 between this gate and the active region 220b functions as the gate insulating film of the reset transistor RST. One of the impurity regions 220a is connected to the reset signal line 208, and the other is connected to the light-emitting element OLED through a wiring 246 formed in the same layer as the terminals 240 and 242.

As shown in FIG. 24 and FIG. 25, the reset transistor RST and the first switching transistor TCT may be provided so as to overlap with each other. In this case, the gate of the reset transistor RST functions as the gates of the reference transistor RCT and the pixel transistor SST, is shared by the first switching transistor TCT, and further functions as the gate of the first switching transistor TCT. Additionally, the active region 220b of the reset transistor RST overlaps with the active region of the first switching transistor TCT.

The pixel 106 of the present embodiment has the pixel structure described in the Sixth Embodiment. Hence, the decrease of the gate potential of the driving transistor DRT can be suppressed, and reduction of size and power consumption of the display device 100 is feasible even if electrostatic capacitance of the storage capacitor Cs is small or even if the storage capacitor Cs is not provided. Additionally, the size of the pixel 106 can be reduced and a high-resolution display device can be provided because the pixel 106 has a structure in which the driving transistor DRT is stacked with the storage capacitor Cs, the pixel transistor SST, reference transistor RCT, and the reset transistor RST are stacked with first switching transistor TCT.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although the cases of the organic EL display device are exemplified, the embodiments can be applied to any kind of display devices of the flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by persons ordinarily skilled in the art.

What is claimed is:

1. A display device comprising:
a power source line;
a driving transistor having a gate and a pair of terminals;
a first switch having a gate and a pair of terminals;
a pixel switch having a gate and a pair of terminals;
a reference switch having a gate and a pair of terminals;
a output switch having a gate and a pair of terminals;
a capacitor having a pair of terminals; and
a light-emitting element having an input terminal and an output terminal,
wherein one of the pair of terminals of the driving transistor is electrically connected to one of the pair of terminals of the first switch and one of the pair of terminals of the output switch,
the other of the pair of terminals of the driving transistor is electrically connected to the power source line,
the other of the pair of terminals of the output switch is electrically connected to the input terminal of the light-emitting element,
the other of the pair of terminals of the first switch is electrically connected to the gate of the driving transistor and one of the pair of terminals of the capacitor,
the other of the pair of terminals of the capacitor is electrically connected to one of the pair of terminals of the pixel switch and one of the pair of terminals of the reference switch,
the other of the pair of terminals of the pixel switch is electrically connected to an image signal line receiving an image signal,
the one of the pair of terminals of the capacitor overlaps with an active region of the driving transistor,
the gate of the first switch functions as the gate of the pixel switch,
each of the active region of the driving transistor, an active region of the output switch, an active region of the pixel switch and an active region of the reference switch includes polysilicon,
the active region of the driving transistor and the active region of the output switch are connected in series between the power source line and the input terminal of the light-emitting element,
both of the active region of the driving transistor and the active region of the output switch are formed in a single polysilicon island,
a first function to prevent a leak current in the first switch is stronger than a second function to prevent a leak current in the pixel switch, and
the first function is stronger than a third function to prevent a leak current in the reference switch.

2. The display device according to claim 1,
wherein the gate of the first switch is shared by the pixel switch.

3. The display device according to claim 1,
wherein the gate of the driving transistor is shared by the capacitor.

4. The display device according to claim 1,
wherein an active region of the first switch includes an oxide semiconductor.

5. The display device according to claim 4,
wherein the active region of the pixel switch overlaps with the active region of the first switch so that the gate of the pixel switch functions as the gate of the first switch, and the gate of the pixel switch is sandwiched between the first switch and the pixel switch.

6. The display device according to claim 1, further comprising:
a reset switch having a gate and a pair of terminals; and
a second switch having a gate and a pair of terminals,
wherein one of the pair of terminals of the reset switch is electrically connected to the input terminal of the light-emitting element,
a fourth function to prevent a leak current in the second switch is stronger than the second function,
the fourth function is stronger than the third function, and
one of the pair of terminals of the second switch is electrically connected to the one of the pair of terminals of the capacitor, the one of the pair of terminals of the first switch, and the gate of the driving transistor.

7. The display device according to claim 6,
wherein an active region of the second switch includes an oxide semiconductor.

8. The display device according to claim 6,
wherein the gate of the reset switch is shared by the second switch.

9. A display device comprising:
a power source line;

a driving transistor having a gate and a pair of terminals;
a first switch having a gate and a pair of terminals;
a pixel switch having a gate and a pair of terminals;
a reference switch having a gate and a pair of terminals;
a reset switch having a gate and a pair of terminals;
an output switch having a gate and a pair of terminals;
a capacitor having a pair of terminals; and
a light-emitting element having an input terminal and an output terminal,
wherein one of the pair of terminals of the driving transistor is electrically connected to one of the pair of terminals of the first switch and one of the pair of terminals of the output switch,
the other of the pair of terminals of the driving transistor is electrically connected to the power source line,
the other of the pair of terminals of the output switch is electrically connected to the input terminal of the light-emitting element,
the other of the pair of terminals of the first switch is electrically connected to the gate of the driving transistor and one of the pair of terminals of the capacitor,
the other of the pair of terminals of the capacitor is electrically connected to one of the pair of terminals of the pixel switch and one of the pair of terminals of the reference switch,
the other of the pair of terminals of the pixel switch is electrically connected to an image signal line receiving an image signal,
the one of the pair of terminals of the capacitor overlaps with an active region of the driving transistor,
the gate of the first switch is shared by the pixel switch, the first switch and the reset switch,
each of the active region of the driving transistor, an active region of the output switch, an active region of the pixel switch and an active region of the reset switch includes polysilicon,
the active region of the driving transistor and the active region of the output switch are connected in series between the power source line and the input terminal of the light-emitting element,
both of the active region of the driving transistor and the active region of the output switch are formed in a single polysilicon island,
a first function to prevent a leak current in the first switch is stronger than a second function to prevent a leak current in the pixel switch,
the first function is stronger than a third function to prevent a leak current in the reference switch, and
the first function is stronger than a fourth function to prevent a leak current in the reset switch.

10. The display device according to claim 9,
wherein the gate of the driving transistor is shared by the capacitor.

11. The display device according to claim 9,
wherein the pixel switch is electrically connected to the first switch through the capacitor.

12. The display device according to claim 9,
wherein an active region of the first switch includes an oxide semiconductor.

13. The display device according to claim 12,
wherein the active region of the first switch overlaps with the active region of the pixel switch and the active region of the reset switch so that the gate of the pixel switch functions as the gate of the first switch, and the gate of the pixel switch is sandwiched between the first switch and the pixel switch.

* * * * *